US008829646B2

(12) United States Patent
Lung et al.

(10) Patent No.: US 8,829,646 B2
(45) Date of Patent: Sep. 9, 2014

(54) INTEGRATED CIRCUIT 3D MEMORY ARRAY AND MANUFACTURING METHOD

(75) Inventors: Hsiang-Lan Lung, Elmsford, NY (US); Hang-Ting Lue, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 646 days.

(21) Appl. No.: 12/430,290

(22) Filed: Apr. 27, 2009

(65) Prior Publication Data

US 2010/0270593 A1    Oct. 28, 2010

(51) Int. Cl.
  *H01L 23/52*    (2006.01)
  *H01L 27/102*   (2006.01)
  *H01L 27/10*    (2006.01)
  *H01L 27/112*   (2006.01)

(52) U.S. Cl.
  CPC .......... *H01L 27/1021* (2013.01); *H01L 27/101* (2013.01); *H01L 27/112* (2013.01); *H01L 27/11206* (2013.01)
  USPC ............................. 257/530; 257/5; 365/148

(58) Field of Classification Search
  USPC .............. 257/5, 209, 211, 529, 530; 365/129, 365/140, 148
  See application file for complete search history.

(56) References Cited

U.S. PATENT DOCUMENTS

| 5,389,566 A | 2/1995 | Lage |
| 5,751,012 A | 5/1998 | Wolstenholme et al. |
| 6,034,882 A | 3/2000 | Johnson et al. |
| 6,507,061 B1 | 1/2003 | Hudgens et al. |
| 6,555,858 B1 | 4/2003 | Jones et al. |
| 6,579,760 B1 | 6/2003 | Lung |
| 6,815,704 B1 | 11/2004 | Chen |
| 6,897,467 B2 | 5/2005 | Doan et al. |
| 6,906,361 B2 | 6/2005 | Zhang |
| 7,018,911 B2 | 3/2006 | Lee et al. |
| 7,030,459 B2 * | 4/2006 | Lai et al. ........................ 257/530 |
| 7,177,169 B2 | 2/2007 | Scheuerlein |
| 7,274,594 B2 | 9/2007 | Pascucci et al. |
| 7,382,647 B1 | 6/2008 | Gopalakrishnan |
| 7,394,089 B2 | 7/2008 | Doyle et al. |
| 7,420,242 B2 | 9/2008 | Lung |
| 7,485,891 B2 | 2/2009 | Hamann et al. |
| 7,504,653 B2 | 3/2009 | Lung |
| 7,560,337 B2 | 7/2009 | Ho et al. |

(Continued)

FOREIGN PATENT DOCUMENTS

| EP | 1936681 A1 | 6/2008 |
| EP | 2048709 A2 | 4/2009 |

OTHER PUBLICATIONS

Choi, Sung-Jin, et al., "Performance Breakthrough in NOR Flash Memory with Dopant-Segregated Schottky-Barrier (DSSB) SONOS Devices," 2009 Symposium on VLSI Technology Digest of Technical Papers, 2 pages.

(Continued)

*Primary Examiner* — Mark Tornow
(74) *Attorney, Agent, or Firm* — Haynes Beffel & Wolfeld LLP

(57) ABSTRACT

A 3D memory device is based on an array of electrode pillars and a plurality of electrode planes that intersect the electrode pillars at interface regions that include memory elements that comprise a programmable element and a rectifier. The electrode pillars can be selected using two-dimensional decoding, and the plurality of electrode planes can be selected using decoding on a third dimension.

26 Claims, 15 Drawing Sheets

(56) References Cited

U.S. PATENT DOCUMENTS

| | | | |
|---|---|---|---|
| 7,579,613 | B2 | 8/2009 | Lung et al. |
| 7,606,059 | B2 | 10/2009 | Toda |
| 7,623,370 | B2 | 11/2009 | Toda et al. |
| 7,718,989 | B2 | 5/2010 | Lai et al. |
| 7,763,878 | B2 | 7/2010 | Horii et al. |
| 7,778,063 | B2 | 8/2010 | Brubaker et al. |
| 7,855,378 | B2 | 12/2010 | Lin et al. |
| 7,868,313 | B2 | 1/2011 | Breitwisch et al. |
| 7,884,343 | B2 | 2/2011 | Lung et al. |
| 2002/0042158 | A1 | 4/2002 | Kersch et al. |
| 2003/0003647 | A1 | 1/2003 | Dennison et al. |
| 2003/0215978 | A1 | 11/2003 | Maimon et al. |
| 2004/0026686 | A1 | 2/2004 | Lung |
| 2004/0114317 | A1 | 6/2004 | Chiang et al. |
| 2005/0019975 | A1 | 1/2005 | Lee et al. |
| 2005/0127347 | A1 | 6/2005 | Choi et al. |
| 2006/0001174 | A1 | 1/2006 | Matsui |
| 2006/0003263 | A1 | 1/2006 | Chang |
| 2006/0077741 | A1 | 4/2006 | Wang et al. |
| 2006/0110878 | A1 | 5/2006 | Lung et al. |
| 2006/0175596 | A1 | 8/2006 | Happ et al. |
| 2007/0045605 | A1 | 3/2007 | Hsueh |
| 2007/0045606 | A1 | 3/2007 | Magistretti et al. |
| 2007/0045708 | A1* | 3/2007 | Lung .................... 257/314 |
| 2007/0140001 | A1 | 6/2007 | Motoi et al. |
| 2007/0235710 | A1 | 10/2007 | Matsuzaki et al. |
| 2007/0246782 | A1 | 10/2007 | Philipp et al. |
| 2008/0096327 | A1 | 4/2008 | Lee et al. |
| 2008/0101109 | A1 | 5/2008 | Haring-Bolivar et al. |
| 2008/0116441 | A1 | 5/2008 | Raghuram et al. |
| 2008/0149913 | A1* | 6/2008 | Tanaka et al. .................... 257/5 |
| 2008/0157053 | A1 | 7/2008 | Lai et al. |
| 2008/0175032 | A1* | 7/2008 | Tanaka et al. ................. 365/51 |
| 2008/0180994 | A1 | 7/2008 | Katsumata et al. |
| 2008/0247230 | A1 | 10/2008 | Lee et al. |
| 2009/0097321 | A1 | 4/2009 | Kim et al. |
| 2009/0148980 | A1 | 6/2009 | Yu |
| 2009/0184360 | A1 | 7/2009 | Jin et al. |
| 2009/0225588 | A1 | 9/2009 | Czubatyj et al. |
| 2009/0298223 | A1 | 12/2009 | Cheek et al. |
| 2010/0054015 | A1* | 3/2010 | Lee et al. ..................... 365/148 |
| 2010/0193763 | A1 | 8/2010 | Chen et al. |
| 2010/0291747 | A1 | 11/2010 | Lung et al. |
| 2011/0034003 | A1 | 2/2011 | Lung |
| 2011/0241077 | A1 | 10/2011 | Lung |

OTHER PUBLICATIONS

Goebel, B., et al., "Fully Depleted Surrounding Gate Transistor (SGT) for 70 nm DRAM and Beyond," IEEE IEDM 2002, 10.8.1-10.8.4.

Jeong, Min-Kyu, et al., "Gate Work Function and Contact Engineering in Nanoscale Vertical Pillar Transistor for DRAM Cell Transistors," Kyoto, Japan, Nov. 5-8, 2007, pp. 112-113.

Johnson, Mark, et al., "512-Mb PROM With a Three-Dimensional Array of Diode/Antifuse Memory Cells," IEEE Journal of Solid-State Circuits, vol. 38, No. 11, Nov. 2003, 9 pages.

Jung, Soon-Moon, et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 2006, pp. 1-4.

Lai, Erh-Kun, et al., "A Multi-Layer Stackable Thin-Film Transistor (TFT) NAND-Type Flash Memory," IEEE IEDM 2006, Dec. 11-13, 2006, pp. 1-4.

Maeda, S, et al. "A Vertical Φ-Shape Transistor (VΦT) Cell for 1Gbit DRAM and Beyond," 1994 Symposium on VLSI Technology, Digest of Technical Papers. Jun. 7-9, 1994 pp. 133-134.

Risch, Lothar, et al., "Recent Progress with Vertical Transistors," Solid-State Device Research Conference, 1997. Proceeding of the 27th European Sep. 22-24, 1997 pp. 34-41.

Tanaka, H., et al., "Bit Cost Scalable Technology with Punch and Plug Process for Ultra High Density Flash Memory," IEEE Symposium on VLSI Technology, Jun. 12-14, 2007, 2 pages.

\* cited by examiner

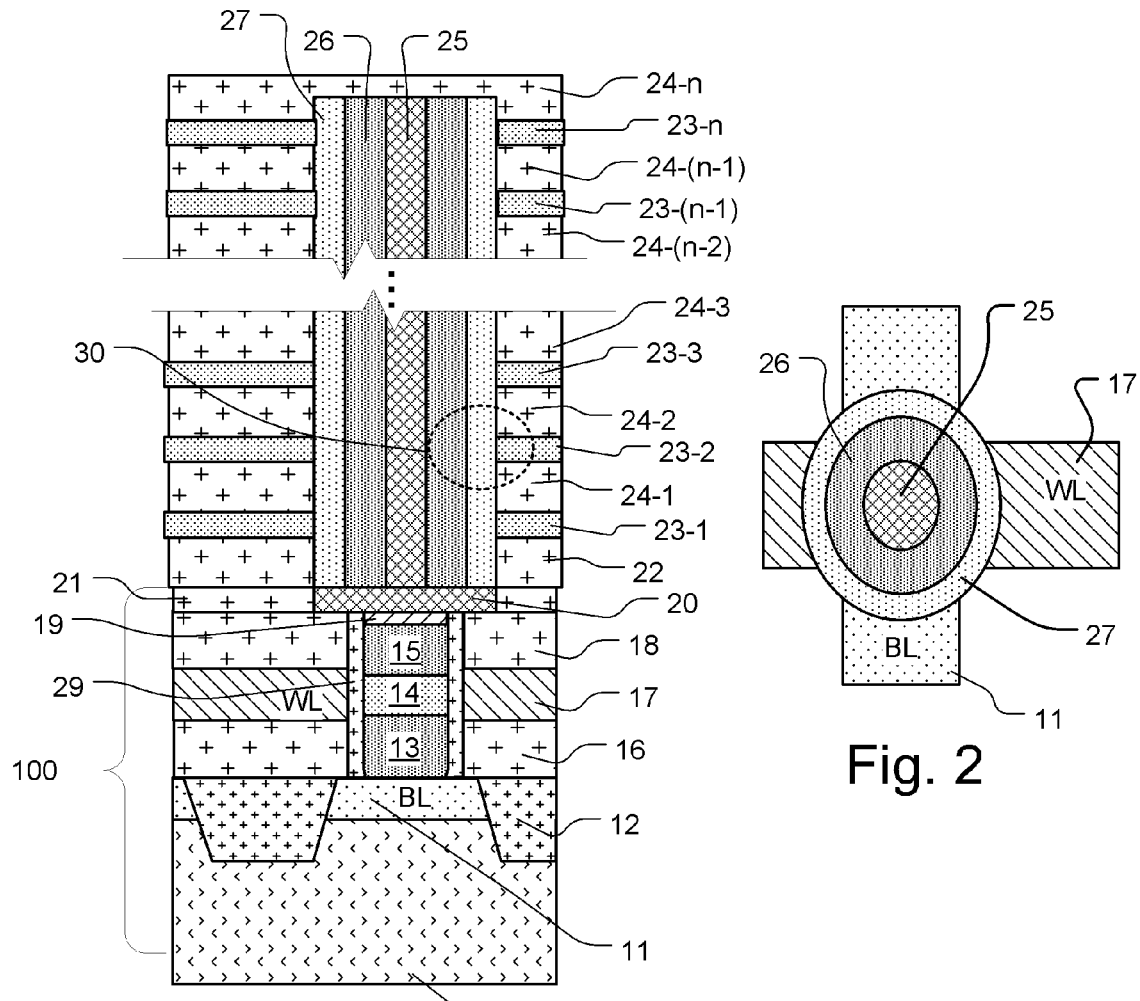
Fig. 1
Fig. 2
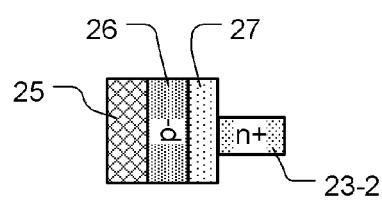
Fig. 3A
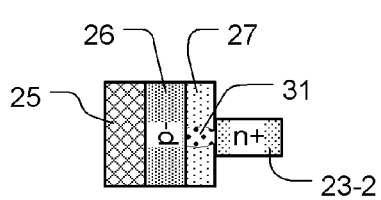
Fig. 3B

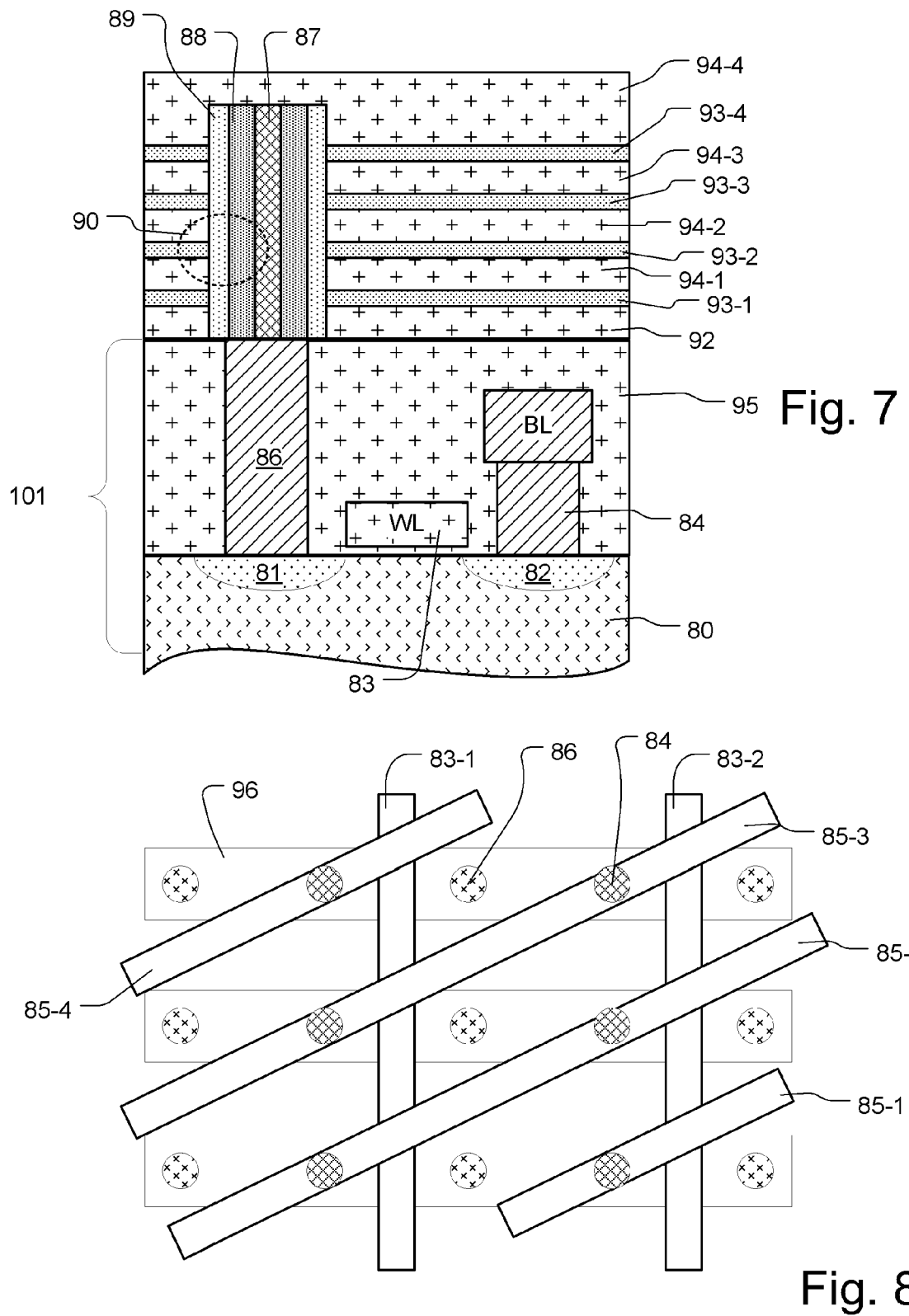

INTEGRATED CIRCUIT 3D MEMORY ARRAY AND MANUFACTURING METHOD

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. Critical lithography steps are expensive, and so it is desirable to minimize them in manufacturing integrated circuits. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, an upper select gate on top. A plurality of horizontal control gates is formed using planar electrode layers that intersect with the pillars. The planar electrode layers used for the control gates do not require critical lithography, and thereby save costs. However, critical lithography steps are required at the top and bottom of each of the vertical cells. Also, there is a limit in the number of control gates that can be layered in this way, determined by such factors as the conductivity of the vertical channel, program and erase processes that are used and so on.

It is desirable to provide a structure for three-dimensional integrated circuit memory with a low manufacturing cost, including reliable, very small memory elements.

SUMMARY OF THE INVENTION

A 3D memory device is based on an array of electrode pillars and a plurality of electrode planes that intersect the electrode pillars at interface regions that include memory elements. The electrode pillars can be selected using two dimensional decoding, and the plurality of electrode planes can be selected using decoding on a third dimension.

An embodiment is described comprising an integrated circuit substrate having a memory cell access layer with an array of access devices and a corresponding array of contacts on the top surface. A plurality of conductive layers lies over or under the array of access devices, separated from each other and from the array of access devices by insulating layers. An array of electrode pillars extends through the plurality of conductive layers and insulating layers. The electrode pillars are coupled to corresponding access devices, such as by contacting the contacts in the array of contacts. Memory elements are located in interface regions between the pillars and the conductive layers, where each of the memory elements comprises a programmable element, such as an anti-fuse, in series with a rectifier, such as a diode.

In an alternative, the array of access devices may be formed over, or between, the conductive layers using thin film transistors or related technology.

In one embodiment, the electrode pillars comprise a doped polysilicon having a first conductivity type, and the plurality of conductive layers comprise a doped polysilicon having an opposite conductivity type, thereby forming a diode including a p–n junction in the interface regions. A layer of anti-fuse material, such as a silicon oxide, or other programmable resistance material, is formed between the anode and the cathode of the diode. Other rectifier technologies can be utilized as well.

Row decoding circuits and column decoding circuits are coupled to the array of access devices and are arranged to select an electrode pillar in response to addresses. Plane decoding circuits are coupled to the plurality of conductive layers, and are arranged to select a conductive layer in response to addresses. Also, the plane decoding circuits are arranged to forward bias the rectifiers in the interface regions of a selected conductive layer, and reverse bias the rectifiers in the interface regions of non-selected conductive layers.

Electrode pillars are described that include a conductor in the form of a core of conductive material, contacting a corresponding contact in the array of contacts, and a layer of memory material between the core and the plurality of conductive layers. The programmable elements in the memory elements comprise active regions in the layer of memory material at the interface regions. Another type of electrode pillar described includes a conductor in the form of a core of conductive material, contacting a corresponding contact in the array of contacts, and a layer of memory material over the core, and a semiconductor sheath over the layer of memory material and contacting the plurality of conductive layers. The programmable elements in the memory elements comprise active regions in the layer of memory material at the interface regions between the core and the semiconductor sheath.

Access devices in the memory cell access layer comprise vertical transistors or horizontal transistors in various embodiments described herein, with bit lines and word lines coupled to the drains and gates of the transistors.

The plurality of conductive layers is formed using a sequence of blanket deposition processes, with patterning to configure the perimeters of the layers for contact to the plane decoding circuitry. The conductive layers can be patterned using a tapered etch process, so that successive layers recede on a taper to form ledges, and contacts are formed that contact the ledges of the layers along the taper.

In another embodiment, the conductive layers have tabs along the perimeters, which are configured for contact to the decoding circuitry. The integrated circuit includes a wiring layer overlying the plurality of conductive layers, which includes conductors coupling the plurality of conductive layers to decoding circuitry. Conductive plugs contact the tabs on the plurality of conductive layers and extend upwardly to the wiring layer. The tabs are arranged in an interleaved fashion in an embodiment that reduces the footprint of the plane decoding circuits. The interleaved tabs are arranged so that conductive plugs that are coupled to interleaved tabs on two or more conductive layers are arranged in a row extending in a direction defined by the interleaved tabs.

A method for manufacturing a memory device is described that includes forming a memory cell access layer or otherwise forming an array of access devices, forming a plurality of conductive layers that overlies an array of access devices in the memory cell access layer, forming an array of electrode pillars extending through the plurality of conductive layers, with memory elements in interface regions between the electrode pillars in the plurality of conductive layers. A technique for forming the plurality of conductive layers includes, after depositing an interlayer dielectric on the top surface of the access layer, for each conductive layer executing the steps of forming a blanket layer of conductive material such as a doped polysilicon and forming a blanket layer of insulating material on the blanket layer of conductive material. A technique for forming an electrode pillar in the array of electrode pillars includes after providing the plurality of conductive layers, defining an electrode via through the plurality of conductive layers over one of the contacts in the array of contacts. Next, a layer of memory material, such as an anti-fuse material is formed on the side walls of the electrode via. Then, the electrode via is filled over the layer of memory material with an electrode material, such as a doped polysilicon, or a doped polysilicon layer followed by a conductive fill establishing a conductive core using a more highly conductive material such as a metal like tungsten, or a metal nitride like titanium nitride.

In one process described herein, a technique for defining a perimeter on the blanket layer of conductive material includes patterning portions of the perimeter so that they include tabs configured for contact to decoding circuitry. A plurality of conductive plugs is formed after forming a plurality of conductive layers, which contact respective tabs on the plurality of conductive layers and extend upwardly to a wiring plane overlying the plurality of conductive layers. The tabs can be arranged in an interleaved fashion, so that conductive plugs that are coupled to interleaved tabs on different conductive layers are arranged in a row, which extends in a direction defined by the interleaved tabs.

A method for manufacturing a plurality of conductive layers is described that comprises forming a plurality of interleaved layers of conductive material and insulating material; forming a tapered etch mask over said plurality of interleaved layers; etching the plurality of interleaved layers using the tapered etch mask to define a taper exposing perimeters of conductive layers in the plurality of interleaved layers so that perimeters of conductive layers in the plurality of interleaved layers extend in shelves beyond the perimeters of conductive layers above; and forming a plurality of conductive plugs, said conductive plugs contacting respective shelves, and extending upwardly to a wiring plane overlying said plurality of interleaved layers. Using a single tapered etch mask and an etching technique such as reactive ion etching, the taper of the mask is transferred to the sides of the plurality of interleaved layers, forming the shelves without additional masking steps.

A novel three-dimensional, one-time-programming memory cell structure is described. In one example, a word line and a bit line are used to drive an access transistor. The access transistor is connected to an electrode pillar. The electrode pillar includes doped polysilicon layer, at least on the outside surface, and a dielectric anti-fuse layer on the polysilicon layer. A sidewall of the electrode pillar is contacted by multiple layers of doped polysilicon, having a conductivity type opposite that of the polysilicon on the pillar. The interface region between each polysilicon layer and the perimeter of the electrode pillar provides a memory cell. An anti-fuse material or other programmable resistive material is provided in the interface region.

A memory cell is programmed by enabling one word line and one bit line coupled to the access transistor for a selected pillar. The voltage bias between the pillar polysilicon and a selected polysilicon layer will breakdown the anti-fuse material, or otherwise program a programmable resistance memory element, in the interface region. A rectifier established by the p–n junction in the interface region, provides isolation between memory cells on different layers within the pillar. Information is read out by sensing the current on a selected bit line or on one of the conductive layers coupled with a selected memory cell.

Other aspects and advantages of the present invention can be seen on review of the drawings, the detailed description and the claims, which follow.

BRIEF DESCRIPTION OF THE DRAWINGS

FIG. 1 is a cross-section of a vertical FET access device and a multi-level electrode pillar including a plurality of memory elements for a device as described herein.

FIG. 2 is a top view of a multi-level electrode pillar with the conductive layers removed.

FIG. 3A illustrates an interface region on the multi-level electrode pillar including a memory element in a high resistance state.

FIG. 3B illustrates an interface region on the multi-level electrode pillar including a memory element in a low resistance state.

FIG. 7 is a cross-section of a horizontal FET access device in a multi-level electrode pillar including a plurality of memory elements for a device as described herein.

FIG. 8 is a layout view showing word lines and bit lines for a memory array implemented as shown in FIG. 7.

DETAILED DESCRIPTION

Figure 4:
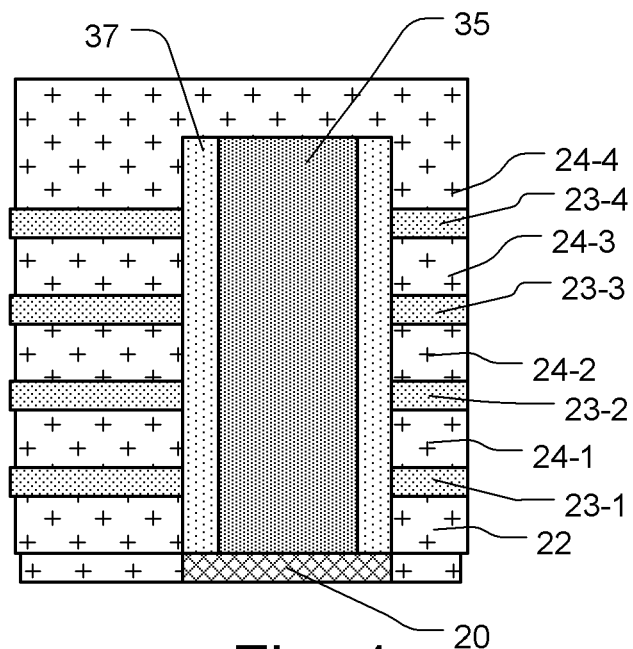
FIG. 4 is a cross-section of an alternative embodiment of a multi-level electrode pillar, including a solid polysilicon core.

A detailed description of embodiments of the present invention is provided with reference to the FIGS. 1-19.

FIG. 1 is a cross-section of a multi-level memory cell. The memory cell is formed on an integrated circuit substrate that in this example includes a semiconductor body 10 with trench isolation structures 12 patterned in rows on the surface. Between the trench isolation structures 12, implants are deposited to form buried diffusion bit lines 11. An access device for a single memory cell pillar is shown which consists of a vertical FET transistor having a drain 13, a channel 14, and a source 15 surrounded by a gate dielectric layer 29. An insulating layer 16 overlies the semiconductor body 10. A word line 17 traverses the array and surrounds the channel 14 of the vertical FET. An insulating layer 18 overlies the word line in this example. A silicide layer 19 is formed on top of the source 15. In this example, a tungsten contact pad 20 is defined and patterned on the silicide layer 19. An insulating layer, including in this example layer 21 and layer 22 overlie the contact pad 20. The parts of the structure shown in the figure from the contact pad 20 to the semiconductor bodies 10 (e.g. bulk silicon) are part of an integrated circuit substrate including a memory cell access layer 100.

A plurality of conductive layers 23-1 through 23-n overlies the contact pad 20 and insulating layer 22. Insulating layers 24-1 through 24-(n−1) separate the conductive layers 23-1 through 23-n from one another. Insulating layer 24-n covers the top conductive layer 23-n. In alternative embodiments, the array of access devices may be formed over the plurality of conductive layers, or between conductive layers, using thin film transistor techniques for example.

An electrode pillar for a multilevel memory consists of a conductor including a central conductive core 25 made for example of tungsten or other suitable electrode material, surrounded by a polysilicon sheath 26. A layer 27 of anti-fuse material, or other programmable memory material, is formed between the polysilicon sheath 26 and the plurality of conductive layers 23-1 through 23-n. The conductive layers 23-1 through 23-n comprise a relatively highly doped, n-type polysilicon in this example, while the polysilicon sheath 26 comprises relatively lightly doped, p-type polysilicon. Preferably, the thickness of the polysilicon sheath 26 is greater than depth of the depletion region formed by the p−n junction. The depth of the depletion region is determined in part by the relative doping concentrations of the n-type and p-type polysilicon used to form it. The conductive layers 23-1 through 23-n and the sheath 26 can be implemented using amorphous silicon as well. Also, other semiconductor materials could be utilized.

Interface regions, such as the region 30, between the plurality of conductive layers 23-1 through 23-n and the pillar include memory elements comprising a programmable element in series with a rectifier as explained in more detail below with reference to FIGS. 3A and 3B.

FIG. 2 shows a top view layout of an electrode pillar including the conductive core 25, the polysilicon sheath 26 and the layer 27 of memory material. The bit lines 11 are laid out in a first direction, and the word lines 17 are laid out in an orthogonal direction. The electrode pillars are surrounded by an annular layer 27 of memory material. The ring shaped interfaces between the layer of memory material in the pillar and each of the layers of conductive material define the interface regions including memory elements.

FIG. 3A shows a portion of a memory element, such as in interface region 30, including conductive layer 23-2, polysilicon sheath 26, conductive core 25, and the layer 27 of anti-fuse material. In the native state, a layer 27 of anti-fuse material, which can be a silicon dioxide, silicon oxynitride or other silicon oxide, for example having a thickness on the order of 5 to 10 nanometers, has a high resistance. Other anti-fuse materials may be used, such as silicon nitride.

After programming, the anti-fuse material breaks down as shown in FIG. 3B, and the active area 31 within the anti-fuse material assumes a low resistance state. In a typical embodiment, using a silicon oxide anti-fuse, a programming pulse may comprise a 5 to 7 volt pulse having a pulse width of about one microsecond, applied under control of on chip control circuits as described below with reference to FIG. 19. A read pulse may comprise a 1 to 2 volt pulse having a pulse width that depends on the configuration, applied under control of on chip control circuits as described below with reference to FIG. 19. The read pulse can be much shorter than the programming pulse. The memory element 30 comprises a programmable element, the anti-fuse layer, and a rectifier formed by the p−n junction, connected in series.

FIG. 4 shows an alternative configuration for the electrode pillar, in which the central conductive core 25 of FIG. 1 is omitted. Instead, the electrode pillar comprises a solid core 35 of polysilicon surrounded by layer 37 of anti-fuse material. Other elements of FIG. 4 are given the same reference numerals as used in FIG. 1 and are not described again.

Figure 5:
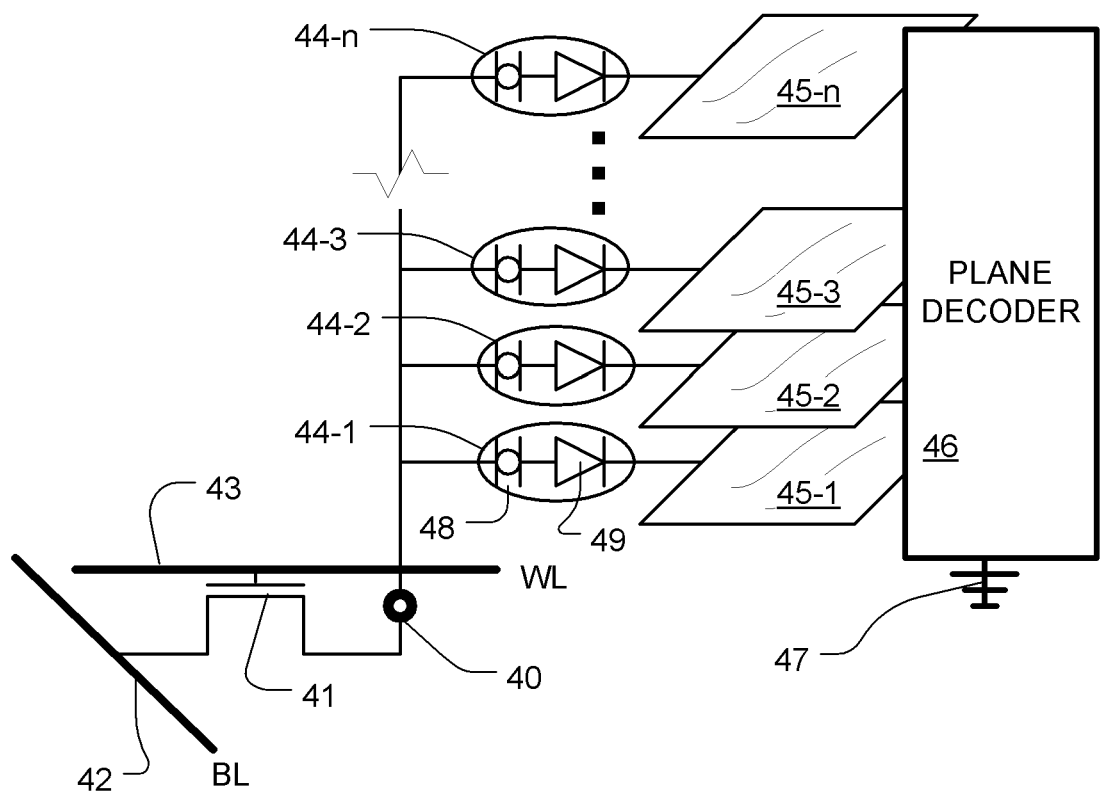
FIG. 5 is a schematic diagram of an access device and multi-level electrode pillar, such as shown in FIG. 1.

FIG. 5 is a schematic illustration of the structure of FIG. 1. An electrode pillar 40 is coupled to an access transistor 41 which is selected using the bit line 42 and word line 43. A plurality of memory elements 44-1 through 44-n are connected to the pillar 40. Each of the memory elements includes a programmable element 48 in series with a rectifier 49. This series circuit schematic represents the structure shown in FIGS. 3A and 3B, even though the layer of anti-fuse material is placed at the p−n junction. The programmable element 48 is represented by a symbol often used to indicate anti-fuses. However, it will be understood that other types of programmable resistance materials and structures can be utilized.

Also, the rectifier 49 implemented by the p−n junction between the conductive layer and the polysilicon in the electrode pillar can be replaced by other rectifiers. For example, a rectifier based on a solid electrolyte like for example germanium silicide, or other suitable material, could be used to provide a rectifier. See U.S. Pat. No. 7,382,647 by Gopalakrishnan for other representative solid electrolyte materials.

Each of the memory elements 44-1 through 44-n is coupled to corresponding electrode plane 45-1 through 45-n, where the electrode planes are provided by the conductive layers of material described herein. The electrode planes 45-1 through 45-n are coupled to a plane decoder 46 which is responsive to addresses to apply a voltage, such as ground 47, to a selected electrode plane so that the rectifier in the memory element is forward biased or conducting, and to apply a voltage to or to float an unselected electrode plane so that the rectifier in the memory element is reverse biased or non-conducting.

Figure 6:
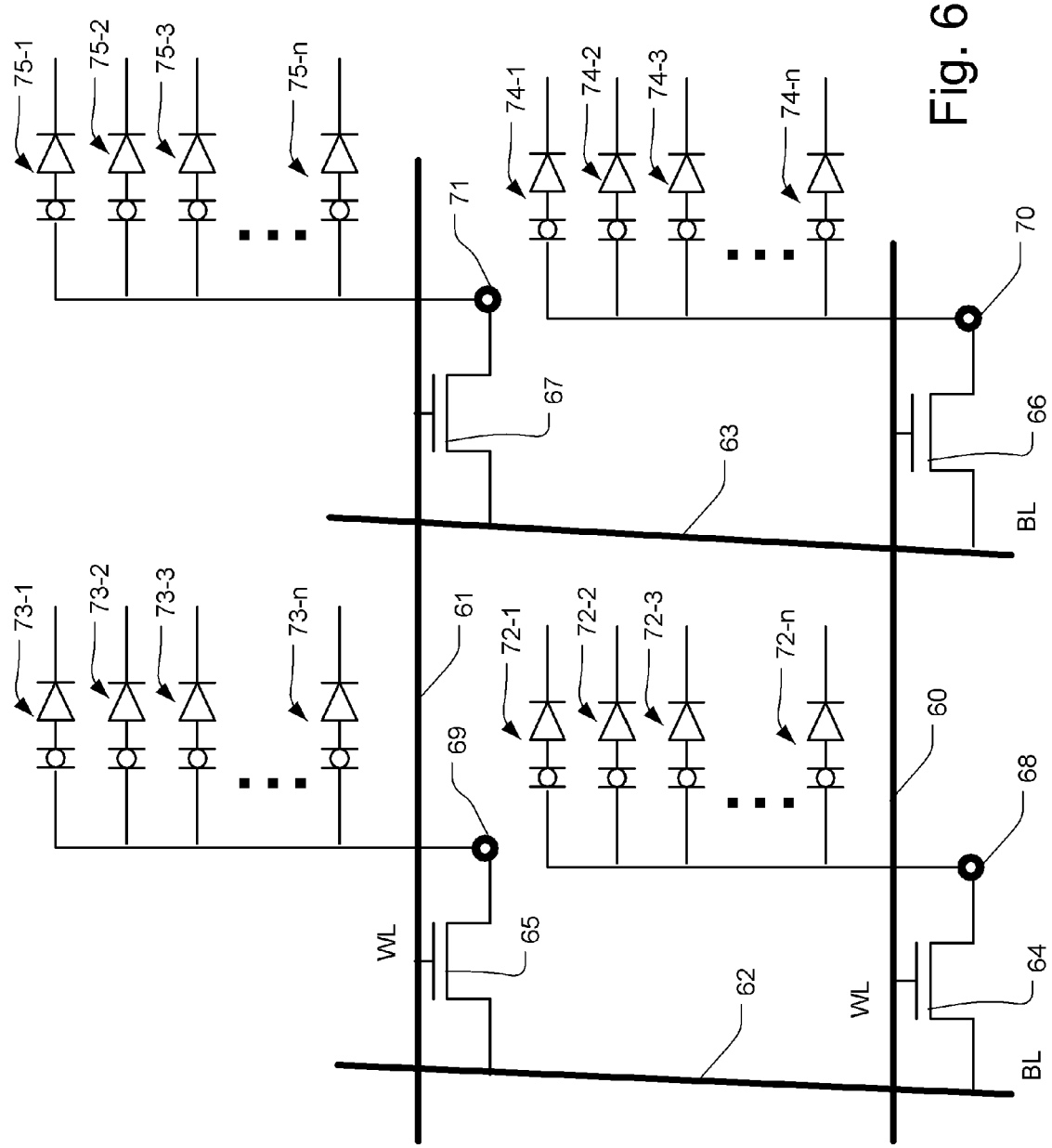
FIG. 6 a schematic diagram of a 2×2×n portion of a memory array composed of multi-level electrode pillars.

FIG. 6 provides a schematic representation of a 2 word-lines×2 bitlines×n planes, three-dimensional 3D memory array. The array includes word lines 60 and 61, which are intersected by bit lines 62 and 63. Access devices 64, 65, 66 and 67 lie at the crosspoints between the bit lines and the word lines. Each access device is coupled to a corresponding electrode pillar 68, 69, 70, 71. Each electrode pillar includes a stack of memory elements that is a number "n" planes deep. Thus, pillar 68 is coupled to memory elements 72-1 through 72-n. Pillar 69 is coupled to memory elements 73-1 through 73-n. Pillar 70 is coupled to memory elements 74-1 through 74-n. Pillar 71 is coupled to memory elements 75-1 through 75-n. The conductive layers are not illustrated in FIG. 6 to avoid crowding the drawing. The 2×2×n array shown in FIG. 6 can be extended to arrays that are thousands of word lines by thousands of bit lines with any number of planes. In representative embodiments, the number n of planes can be powers of 2 to facilitate binary decoding, such as 4, 8, 16, 32, 64, 128 and so on.

FIG. 7 is a cross-section of a multi-level memory cell having a horizontal FET access device. The memory cell is formed on an integrated circuit substrate that in this example includes a semiconductor body 80. Optional trench isolation structures (not shown) can be formed on the surface to isolate regions of the device. Implants are deposited to form source 81 and drain 82 for the access device. A word line 83 is formed between the source 81 and drain 82 over a gate dielectric. An interlayer dielectric 95 overlies the word line in the semiconductor body 80. Plug 84 and plug 86 are formed in the interlayer dielectric 95. Plug 84 extends to a patterned metal layer including bit line BL. Plug 86 extends to a surface of the interlayer dielectric 95 and provides a contact on which the electrode pillar is formed. Thus the memory cell access layer 101, as identified by the bracket in the embodiment of FIG. 7, includes the elements from the surface of the interlayer dielectric 95 to the semiconductor body 80.

A plurality of conductive layers 93-1 through 93-4 in this example overlies an insulating layer 92 that is formed over the top surface of the memory cell access layer 101. Insulating layers 94-1 through 94-3 separate the plurality of conductive layers. Insulating layer 94-4 overlies the conductive layer 93-4.

A multilevel electrode pillar consists of the conductive core including a central conductive core 87 surrounded by polysilicon sheath 88. A layer 89 of anti-fuse material, or other programmable resistance material, is formed between the polysilicon sheath 88 and a plurality of conductive layers 93-1 through 93-4, providing memory elements (e.g. element 90) in the interface region. The conductive layers 93-1 through 93-4 for this example comprise a relatively highly doped, n+ polysilicon, while the semiconductor sheath 88 comprises a more relatively lightly doped, p-type polysilicon.

FIG. 8 shows a layout view for an array made using access devices like the horizontal FET shown in FIG. 7. The array includes contact plugs 86 for electrode pillars and contact plugs 84 for bit lines. The bit lines 85-1 through 85-4 are arranged diagonally. The word lines 83-1 through 83-2 are arranged vertically in this layout. The active regions 96 for the access devices are patterned as shown, so that they are essentially orthogonal to the word lines 83-1, 83-2. Trench isolation structures (not shown) can optionally be formed in parallel with the word lines 83-1, 83-2, between the columns of contact plugs 86 and columns of contact plugs 84 in adjacent access transistors.

Figure 9A:
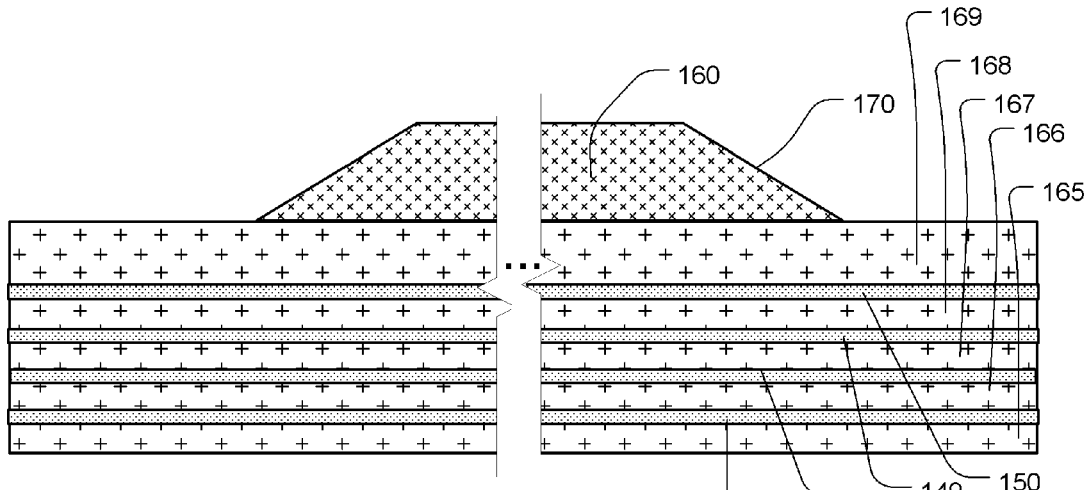
FIGS. 9A-9C illustrate stages in a process for patterning the perimeter of the conductive layers, based on a tapered etch.
Figure 9B:
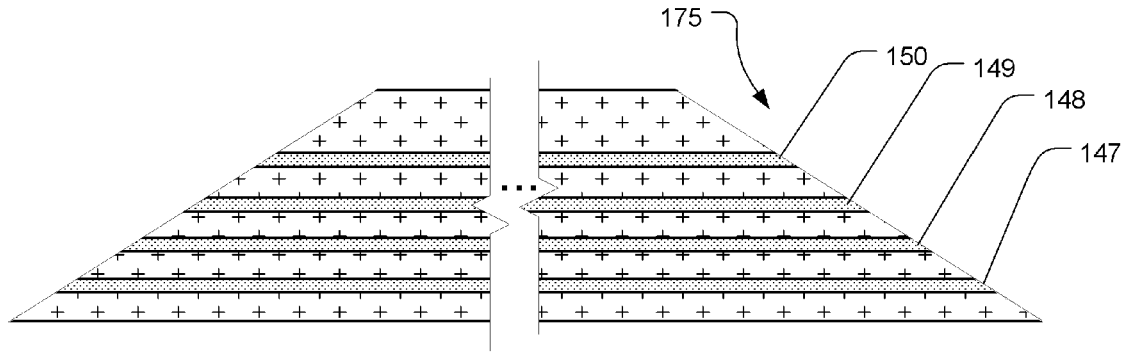
Figure 9C:
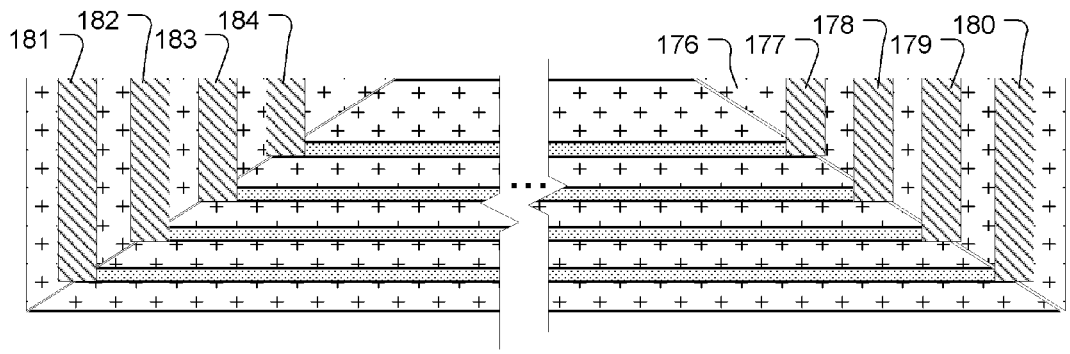

FIGS. 9A, 9B and 9C illustrate stages in a process for defining the perimeters of the layers of conductive material within a plurality of interleaved conductive layers and insulating layers, in order to make contact to the individual conductive layers for decoding. In FIG. 9A, a stack is illustrated including alternating conductive layers 147, 148, 149 and 150 and insulating layers 265, 266, 267, 268 and 269. The conductive layers and insulating layers are deposited in alternating blanket depositions, which can cover the entire memory area on the integrated circuit as indicated by the break lines in the drawing. In order to pattern the perimeters of the conductive layers, a mask 160 is formed. The mask 160 has tapered sides 170. In order to make the mask, a layer of hard mask material such as silicon nitride can be deposited over the structure. A layer of photoresist can then be patterned and etched to define the tapered sides on the photoresist. The resulting structure is then etched, with the taper in the photoresist layer being transferred to a corresponding taper 170 on the hard mask 160.

As illustrated in FIG. 9B, the tapered hard mask 160 is then used in a similar manner. An etching process, such as a reactive ion etch RIE, is applied so that the taper 170 on the hard mask is transferred to a corresponding taper 175 in the stack of conductive layers. In some embodiments, the hard mask might be omitted, and the tapered photoresist element is used during the taper etch of the stack. The edges of the conductive layers 150-147 are staggered to form shelves around their perimeters. The widths of the shelves caused by the stagger between each layer can be determined by the thicknesses of the insulating layers between the conductive layers, and the slope of the taper 175.

The etching process used to define the taper 170 on the hard mask and the taper 175 on the stack of conductive layers can be one continuous etching process. Alternatively, a first process can be used to define the taper 170 on the hard mask 160, at a second etch process used to define the taper 175 on the stack of conductive layers.

FIG. 9C illustrates a next stage in the process. After forming the taper 175, an insulating fill 176 is deposited and planarized over the stack of conductive layers 150-147. Then, vias are defined using a lithographic step which patterns all of the vias for all the layers at the same time. An etching process is applied which is highly selective for the conductive material in the conductive layers 150-147, relative to the fill layer 176. In this way, the etching process within each of the vias stops on the corresponding conductive layer. The vias are then filled with plugs 177, 178, 179, 180 on one side of the perimeter of the memory array area, and plugs 181, 182, 183, 184 on another side of the perimeter memory array area. Thus, the perimeters of the conductive layers are patterned and contact vias are formed using only one lithographic step to define a hard mask 160, and one lithographic step to define the location of the vias used for the contacts 177-184. Also, only two (or possibly three) etch processes are applied to create the structure shown in FIG. 9C.

Figure 10:
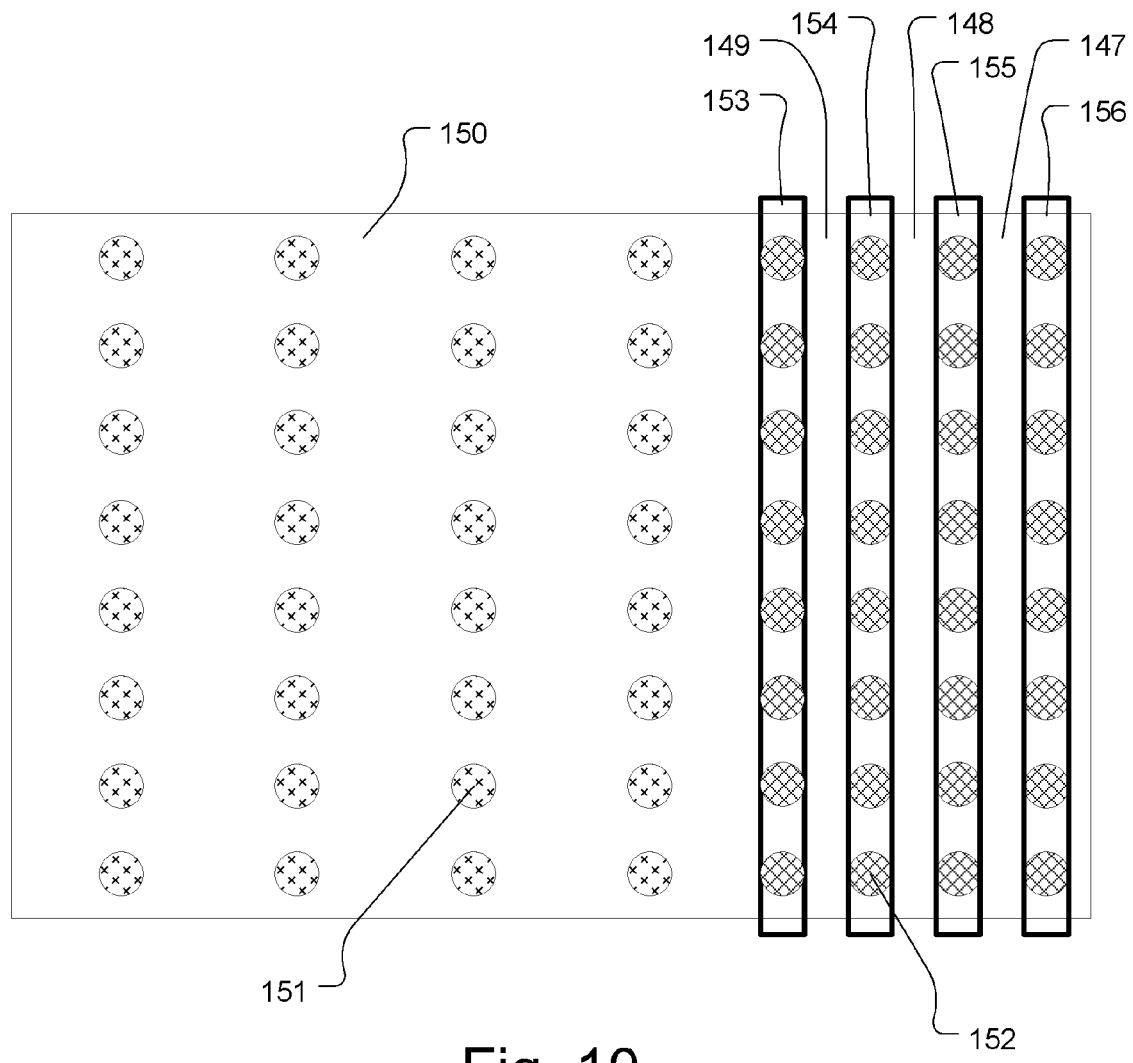
FIG. 10 is a layout view of a conductive layer and interconnect wiring for connecting the conductive layers to plane decoding circuitry.

FIG. 10 is a simplified layout view of a portion of the array, showing overlying interconnects for connecting the stack of conductive layers to plane decoding circuits. In FIG. 10, the top dielectric layer 150 is illustrated. An array of electrode pillars (e.g. pillar 151) penetrates the dielectric layer 150.

Contact plugs, such as plug 152, which correspond with the plugs 177-184 in FIG. 9C, are arranged along the perimeters of the conductive layers. The contact plugs in a row along the edge of the layer 150 are coupled to an interconnect wire 153 overlying the stack of conductive layers.

Conductive layer 149 extends to the right of the interconnect wire 153, and contact plugs in a row along the edge of layer 149 are coupled to the interconnect wire 154. Conductive layer 148 extends to the right of the interconnect wire 154, and contact plugs in a row along the edge of layer 148 are coupled to the interconnect wire 155. Conductive layer 147 extends to the right of the interconnect wire 155, and contact plugs in a row along the edge of layer 147 are coupled to the interconnect wire 156.

A simplified view of the interconnect wiring 153-156 overlying the array is intended to illustrate a manner of coupling the plurality of conductive layers in the memory array to interconnect wiring. It can then be routed as necessary to plane decoding circuitry. Also, the interconnect wiring can be arranged to distribute the bias voltages applied to the layers of conductive material more uniformly across the area of the array.

Figure 11:
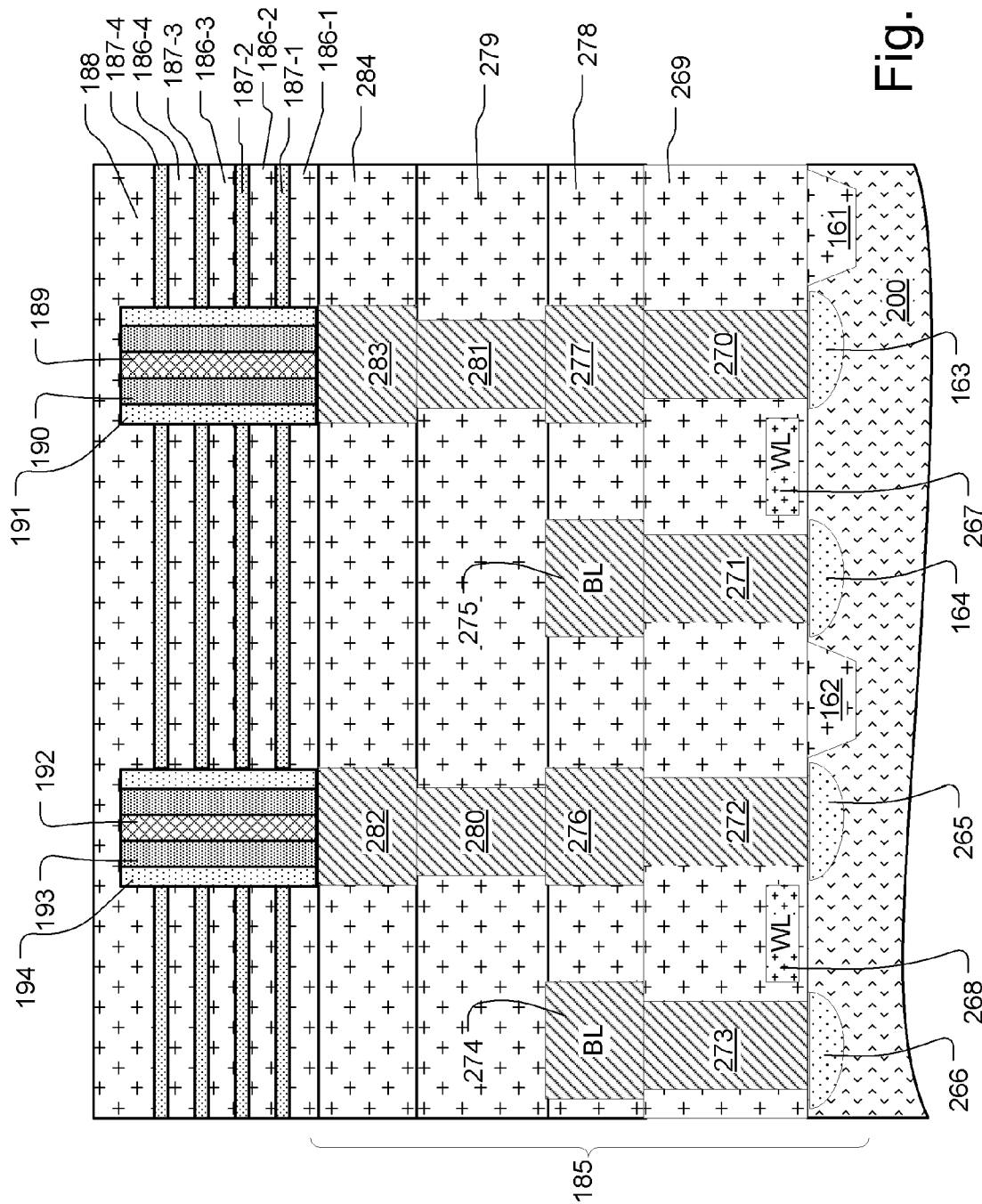
FIG. 11 is a cross-section of a portion of a memory array including horizontal FET access devices
Figure 12:
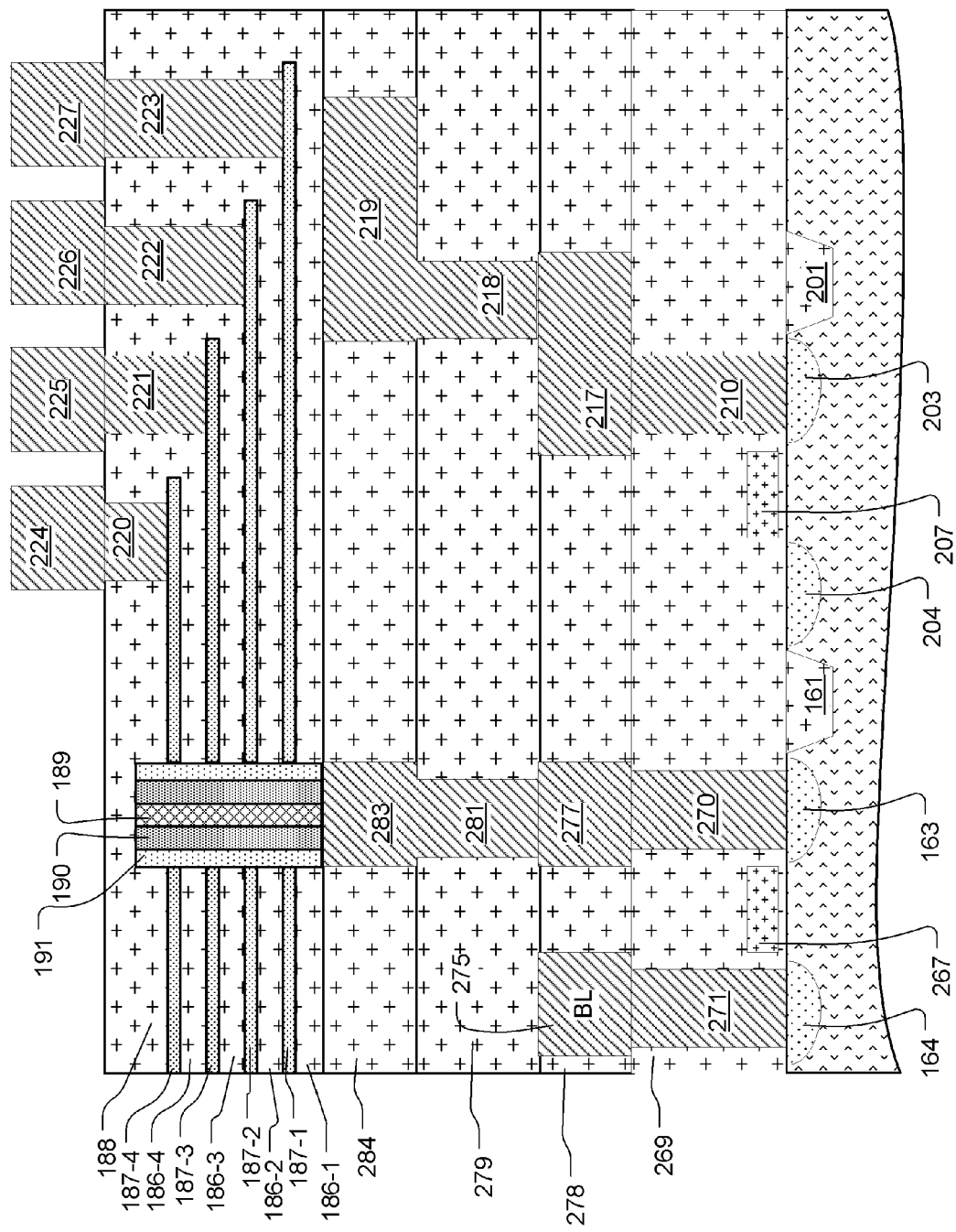
FIG. 12 is a cross-section of another portion of a memory array including horizontal FET access devices, and interconnect plugs and vias on the perimeters of the conductive layers.

FIGS. 11 and 12 together show a cross-section of a portion of an integrated circuit including a 3D memory array, and a memory cell access structure that includes multiple metallization layers and peripheral circuitry. Also, FIGS. 11 and 12 can be referred to during the description of the manufacturing method set forth below with reference to FIGS. 13A-13B.

FIG. 11 shows a portion of the memory array formed on the substrate 200. Horizontal FET's are defined by source regions 163, 165 and drain regions 164, 166 in the substrate 200. Trench isolation structures 161 and 162 isolate regions in the substrate. Word lines 267 and 268 provide gates for the access devices. Interlayer dielectric 269 overlies the word lines 267, 268 and substrate. Contact plugs 270, 271, 272 and 273 extend through the interlayer dielectric 269 to an overlying metallization plane with dielectric fill 278 including bit lines 275 and 274 coupled to contacts 271 and 273. Contact pads 277 and 276 extend through the dielectric fill 278 to overlying contacts 280 and 281, which extend through another interlayer dielectric 279. Another metallization plane with dielectric fill 284 overlies the dielectric layer 279. Contact pads 282 and 283 are coupled to the underlying contacts 280 and 281, providing connection to the access devices below. The memory cell access layer 185 in this embodiment includes the components from the contact pads 282, 283 through the access transistors that include the source and drain regions 163-166 in the substrate 200. The substrate 200 can comprise bulk silicon or a layer of silicon on an insulating layer or other structures known in the art for supporting integrated circuits.

A plurality of electrode pillars is arranged on top of the memory cell access layer 185. In this drawing, a first electrode pillar including conductive core 192, polysilicon sheath 193, and anti-fuse material layer 194, and a second electrode pillar including conductive core 189, polysilicon sheath 190, and anti-fuse material layer 191 are illustrated. The first electrode pillar is coupled to the pad 282. The second electrode pillar is coupled to the pad 283. An insulating layer 286-1 overlies the memory cell access layer 185. Conductive layer 187-1 overlies the insulating layer 286-1. Alternating conductive layers 187-2 through 187-4, and insulating layers 286-2 through 286-4 are formed on top of the conductive layer 187-1. A dielectric fill 188 overlies the structure and has a planar top surface.

FIG. 12 shows a continuation of the device out into the periphery region where supporting circuitry is formed and contacts are made to the plurality of conductive layers. In FIG. 12, the electrode pillar including conductive core 189, polysilicon sheath 190 and anti-fuse layer 191 are illustrated, and the same reference numerals are applied as are used in FIG. 11. As shown in FIG. 12, a peripheral device includes a transistor formed by source 204, gate 207 and drain 203. Trench isolation structure 201 is illustrated in the drawing. A wide variety of devices are implemented in the periphery to support decoding logic and other circuits on the integrated circuit. The multiple metallization planes are used in the periphery circuit for wiring interconnects. Thus, a contact plug 210 extends from drain 203 to a wire 217 in an upper layer. Plug 218 extends from the wire 217 to wire 219 in another layer.

The conductive layers 187-1 through 187-4 are coupled to corresponding contact plugs 223, 222, 221, 220. Interconnect wires 224 through 227 are coupled to the plugs and provide for interconnection between the plurality of conductive layers and decoding circuitry in the periphery of the device.

Figure 13A:
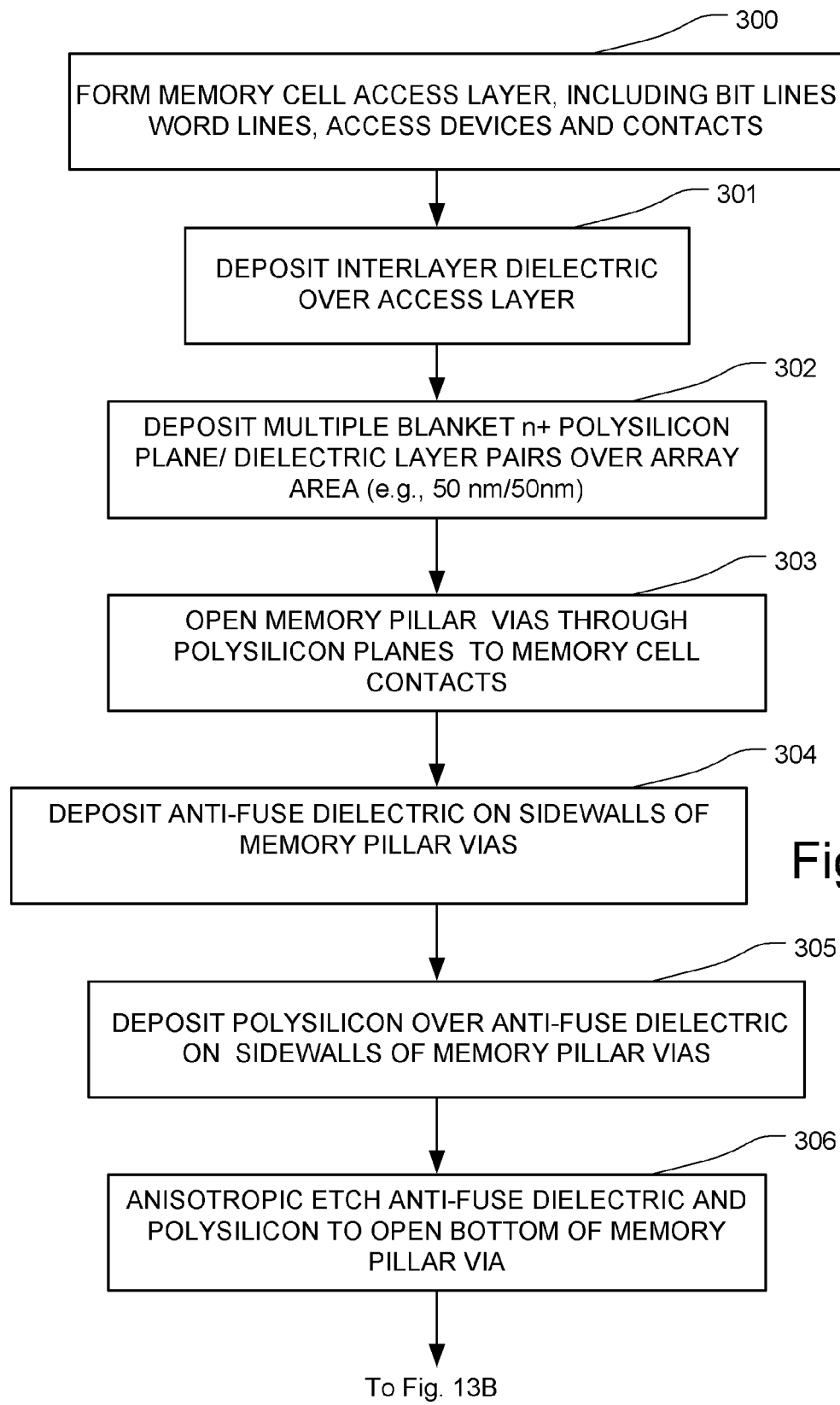
FIGS. 13A-13B are a flow chart for a method for manufacturing a memory array as described herein.
Figure 13B:
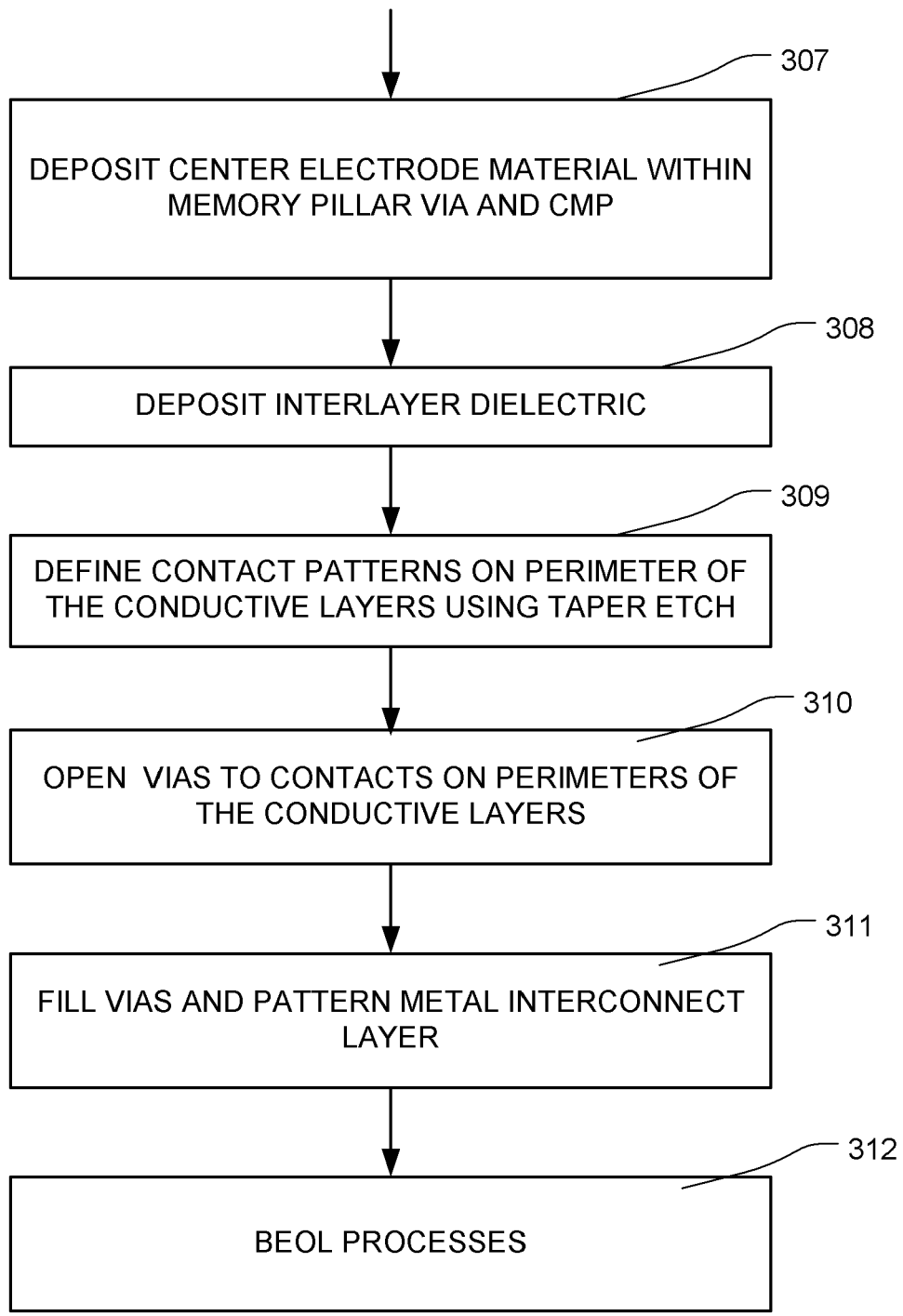

FIGS. 13A and 13B include a flow chart for a manufacturing method which can be applied to make the structure shown in FIGS. 11 and 12. For the purposes of this application, the first step 300 involves forming the memory cell access layer, including bit lines, word lines, access devices and contacts. At this stage, peripheral circuitry on the integrated circuit substrate is also formed as shown in FIG. 12. As a result of this process, a top surface of the memory cell access layer in the memory region of the device has an array of contacts, including contacts 282, 283 of FIG. 11. At this stage, standard manufacturing techniques have been applied including all the necessary patterning and etching steps needed for forming the peripheral circuitry and the access devices. The contacts and interconnects involved in the memory cell access layer should be made using a refractory metal, such as tungsten, so that the thermal budget involved in the deposition of a large number of layers of polysilicon will not interfere with the underlying interconnects.

Next, an interlayer dielectric (e.g. 186-1) is deposited over the memory cell access layer (301). The interlayer dielectric can be silicon dioxide, silicon oxide nitride, silicon nitride or other interlayer dielectric materials. Next, alternating blanket depositions of conductive layers and dielectric layers are performed (302). These blanket depositions provide the plurality of conductive layers (e.g. 187-1 through 187-4) acting a electrode planes. The conductive layers can be relatively highly doped n-type polysilicon (n+ polysilicon). A typical thickness for the conductive layers can be on the order of 50 nanometers. The dielectric layers form the insulation between the conductive layers. The thicknesses of the insulating layers can also be on the order of 50 nanometers in one example. Other examples will include larger or smaller thicknesses for the polysilicon, or other semiconductor materials, and dielectric layers as desired or required for particular implementations. Also, polysilicon layers processed if desired to form a silicide layer on a top side of the polysilicon. In a next stage, a lithographic pattern is applied to define and open vias for the memory cell pillars through the plurality of polysilicon planes to corresponding contacts on the memory cell access layer (303). Reactive ion etching process can be applied to form deep, high aspect ratio holes through the silicon dioxide and polysilicon layers to provide vias for the electrode pillars.

After opening the vias, a layer of anti-fuse dielectric is deposited on the side walls of the electrode pillar vias (304). The anti-fuse dielectric can be deposited using atomic layer deposition or chemical vapor deposition technologies. Suitable materials include silicon oxide, silicon nitride, silicon oxide nitride, multilayer structures such as oxide/nitride/oxide, and others. The typical thickness for a layer of anti-fuse dielectric can be on the order of 5 to 10 nanometers, more or less. In embodiments using silicon dioxide as the anti-fuse material, it can be formed using a thermal oxidation process on the exposed edges of the plurality of layers of polysilicon. In this embodiment, the anti-fuse material may not form a continuous layer on the sides of the electrode pillar, but rather only form in the interface regions.

After formation of the anti-fuse layer, a layer of polysilicon is deposited over the anti-fuse dielectric on the side walls of the electrode pillar vias (305). In one embodiment, a thin layer of polysilicon, having an opposite conductivity type to that used in the conductive layers, is applied over the anti-fuse dielectric. Thus, a relatively lightly doped p-type polysilicon can be applied, for example.

The resulting layers of anti-fuse material and polysilicon are anisotropically etched to open the bottom of the electrode pillar via, exposing the underlying contact (306). In a next step, the center electrode material is deposited within the electrode pillar via (307). This step can involve the first deposition of polysilicon so that the combined thickness of the thin polysilicon layer deposited in step 305, and polysilicon deposited in step 306 is greater than the depth of the depletion region established by the p–n junction in interfaces between the electrode pillar and the plurality of conductive layers. By doping the plurality of conductive layers with higher concentration than used in the electrode pillar, the depletion regions will lie within the electrode pillars, rather than within the conductive layers. Following the additional deposition of polysilicon, a more conductive material can be deposited in the central core. After depositing the center electrode material, the resulting structure is etched back using a chemical mechanical polishing process or other planarizing process.

Next, an interlayer dielectric is deposited over the structure (block 308).

After forming the plurality of conductive layers, contact areas are defined on the perimeters of the conductive layers using the taper etch process (309) described above with reference to FIGS. 9A-9C. Alternative techniques can be used for defining contact areas on the plurality of conductive layers. Alternative techniques may involve lithographic steps at other stages in the process, as will be understood according to the techniques applied. One technique is described below with reference to FIG. 14. After patterning the perimeters of the conductive layers, an insulating fill is deposited and planarized over the structure. Then, vias are opened through the insulating fill to contacts on the perimeters of the conductive layers (310).

The vias are filled using tungsten or other contact material, and metallization processes are applied to provide interconnection between the contacts to the conductive layers and plane decoding circuitry on the device (311). Finally, back end of line BEOL processes are applied to complete integrated circuit (312).

Figure 14A:
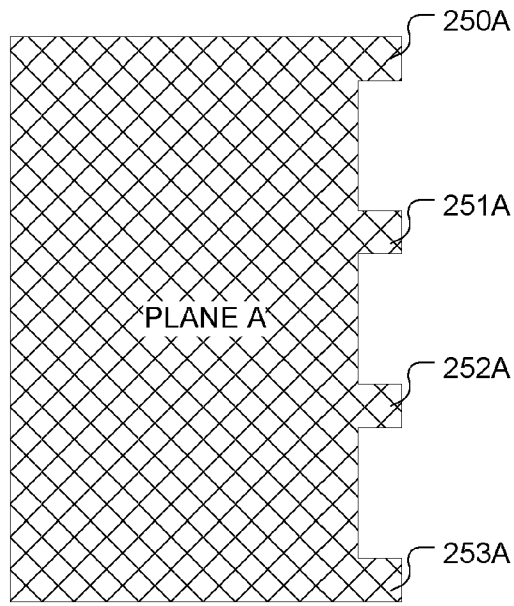
FIGS. 14A-14B illustrate the layout of conductive layers including interleaved tabs arranged for making contact with interconnect vias and plugs.
Figure 14B:
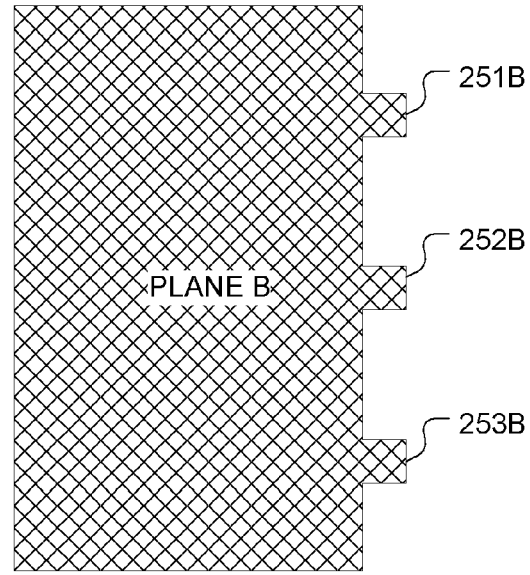
Figure 15:
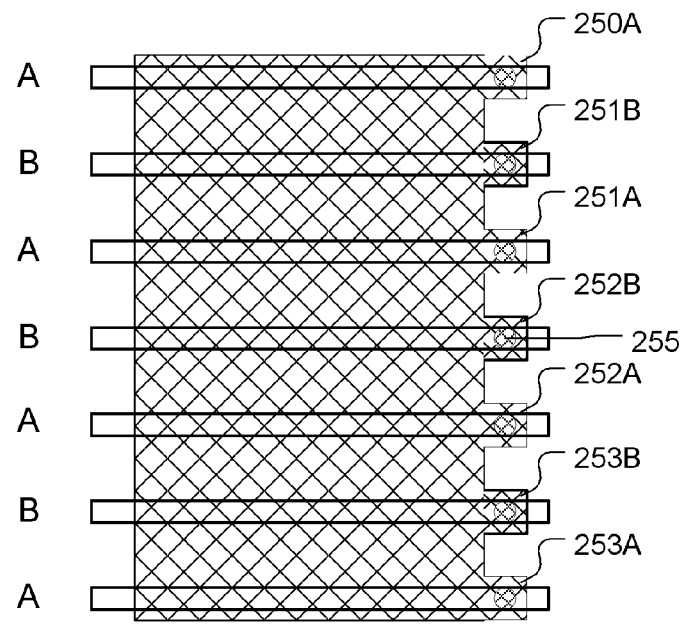
FIG. 15 shows a top view of the conductive layers including interleaved tabs and overlying wiring for interconnecting with decoding circuitry.

FIGS. 14A and 14B illustrate patterns for conductive layers in the plurality of conductive layers that can be applied to establish interconnect contacts on the perimeter of the planes, which include interleaved tabs. Thus, FIG. 14A shows plane A and FIG. 14B shows plane B. Tabs 250A through 253A are positioned along the perimeter of plane A. Tabs 251B through 253B are positioned along the perimeter of plane B. The tabs are positioned so that when the planes are overlaid as shown in FIG. 15, the contacts (e.g. contact 255) are interleaved and define a row that is parallel to the perimeter of the planes. Thus, interconnect wires for plane A and interconnect wires for plane B can be routed in parallel to the tabs. This technique reduces the area needed for making contact to the plurality of conductive layers significantly. Interleaving can involve more than 2 planes, such as 8 or 16 planes or more in order to save significantly more area on the device. This technique however involves a non-critical pattern step with each blanket deposition of conductive material.

Figure 16:
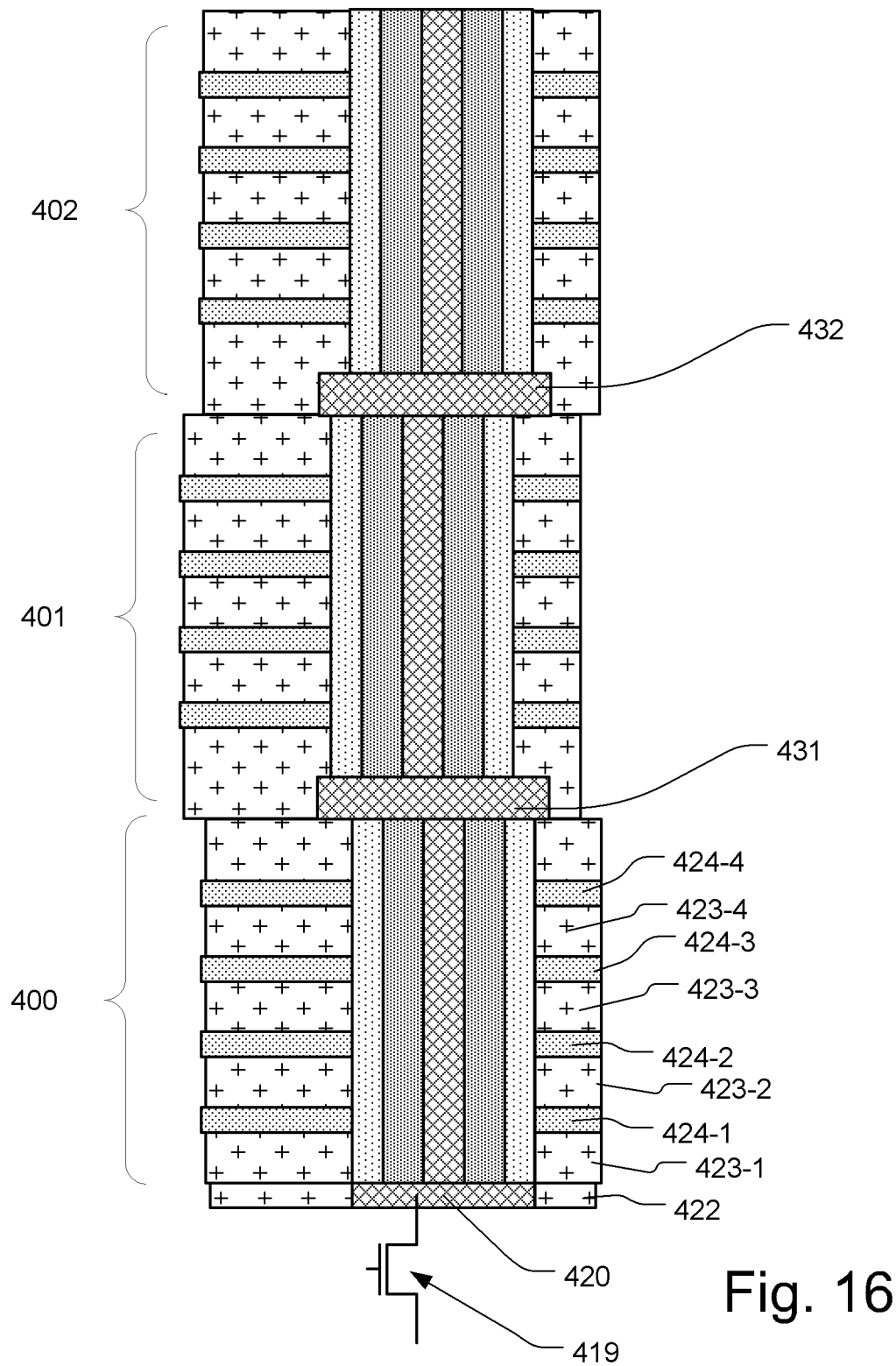
FIG. 16 is a cross-section diagram illustrating an electrode pillar stack adaptable for a very large number of memory planes.

FIG. 16 illustrates one technique for extending the number of conductive layers that can be applied in a single electrode pillar, while maintaining a relatively small via footprint. The structure shown in FIG. 16 includes a stack including a number of sets 400-402 of conductive layers. The first set 400 of conductive layers, is formed by alternating insulator layers 423-1 through 423-4 and conductive layers 424-1 through 424-4 over layer 422. The other sets 401 and 402 comprise similar structures. The process involves first making the first set 400 of conductive layers, defining an electrode pillar via through the first set, and forming the first part of the electrode pillar. The first part of the electrode pillar contacts pad 420 which is coupled to an access device 419. Next, a second set 401 of conductive layers is defined over the first. An electrode pillar via is defined through the second set 401, which opens a via to the first part of the electrode pillar. A second part of the electrode pillar is formed within the via through the second set 401 of conductive layers.

As shown in the drawing, the second part of the electrode pillar may be slightly misaligned with the first, because alignment tolerance is involved in the lithographic processes used to define the vias. Optionally, a contact pad 431 can be formed between the layers by a lithographic step to provide for better alignment tolerance among the lithographic processes if required. Finally, an electrode pillar via is defined through the third set 402 of conductive layers, which opens a via to the second part of the electrode pillar. The third part of the electrode pillar is formed within the third set 402 of conductive layers. The drawing also shows the optional contact pad 432 between the second and third parts of the electrode pillar. Although the drawing shows four conductive layers per set, embodiments of the technology can involve using a larger number of planes, such as 16, 32, 64 or more, contacting each stacked part of the electrode pillar.

Figure 17:
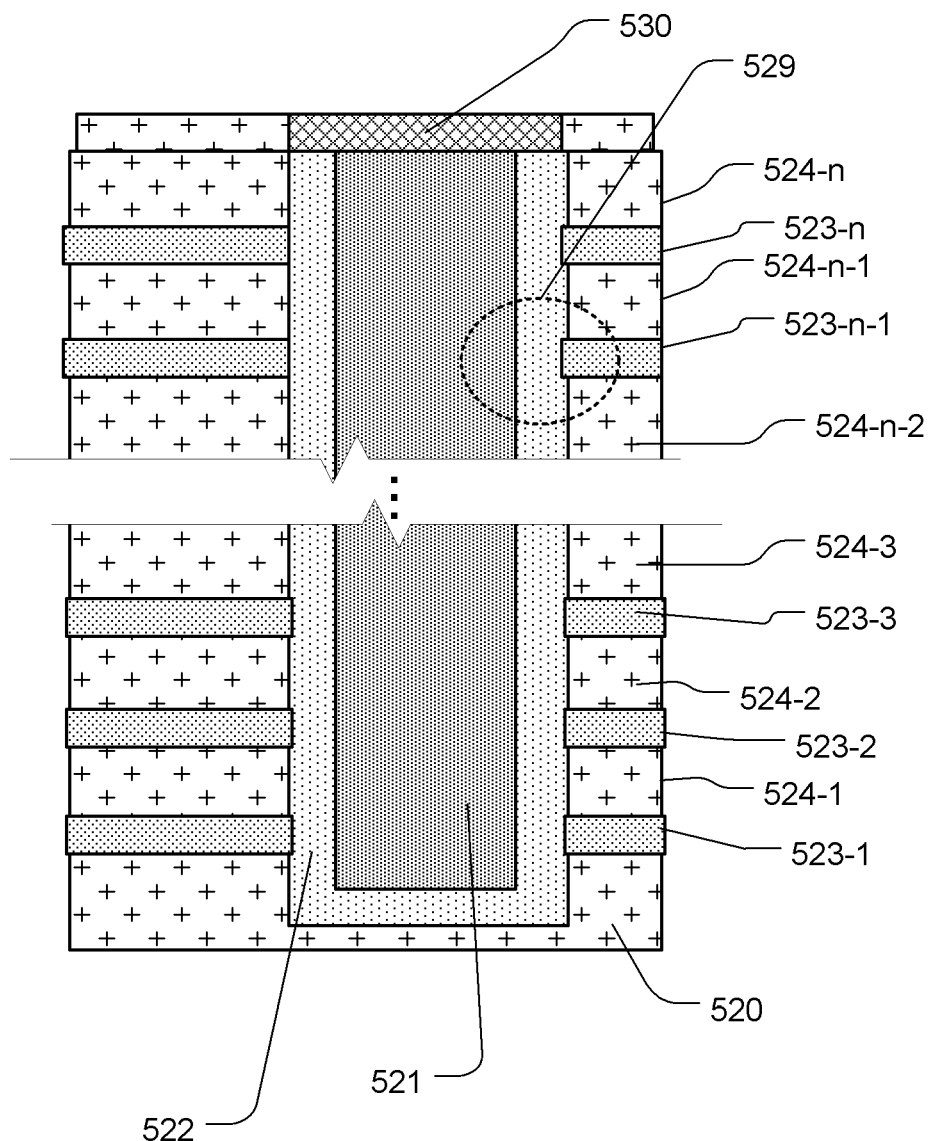
FIG. 17 is a cross-section of an alternative embodiment of a multi-level electrode pillar, including a top contact coupled to decoding circuits.

FIG. 17 illustrates an inverted pillar embodiment, including a contact 530 on top to which row and column decoding circuits are coupled. Row and column decoding circuits can be made using for example thin-film transistors over the pillar. The memory cell stack is formed on an integrated circuit substrate not shown. An insulating layer 520 overlies the substrate. A plurality of conductive layers 523-1 through 523-n overlies the layer 520. Insulating layers 524-1 through 524-n-1 separate the conductive layers 523-1 through 523-n from one another. Insulating layer 524-n covers the top conductive layer 523-n.

An electrode pillar for a multilevel memory in this example consists of a semiconductor core 521, made for example of p-type polysilicon. A layer 522 of anti-fuse material, or other programmable memory material, is formed between the semiconductor core 521 and the plurality of conductive layers 523-1 through 523-n. The conductive layers 523-1 through 523-n comprise a relatively highly doped, n-type polysilicon in this example. The layer 522 of anti-fuse material may line the bottom of the electrode pillar as shown, eliminating a manufacturing step for etching through that layer for contact to underlying decoding circuits.

Interface regions, such as the region 529, between the plurality of conductive layers 523-1 through 523-n and the pillar include memory elements comprising a programmable element in series with a rectifier, as explained above.

Figure 18:
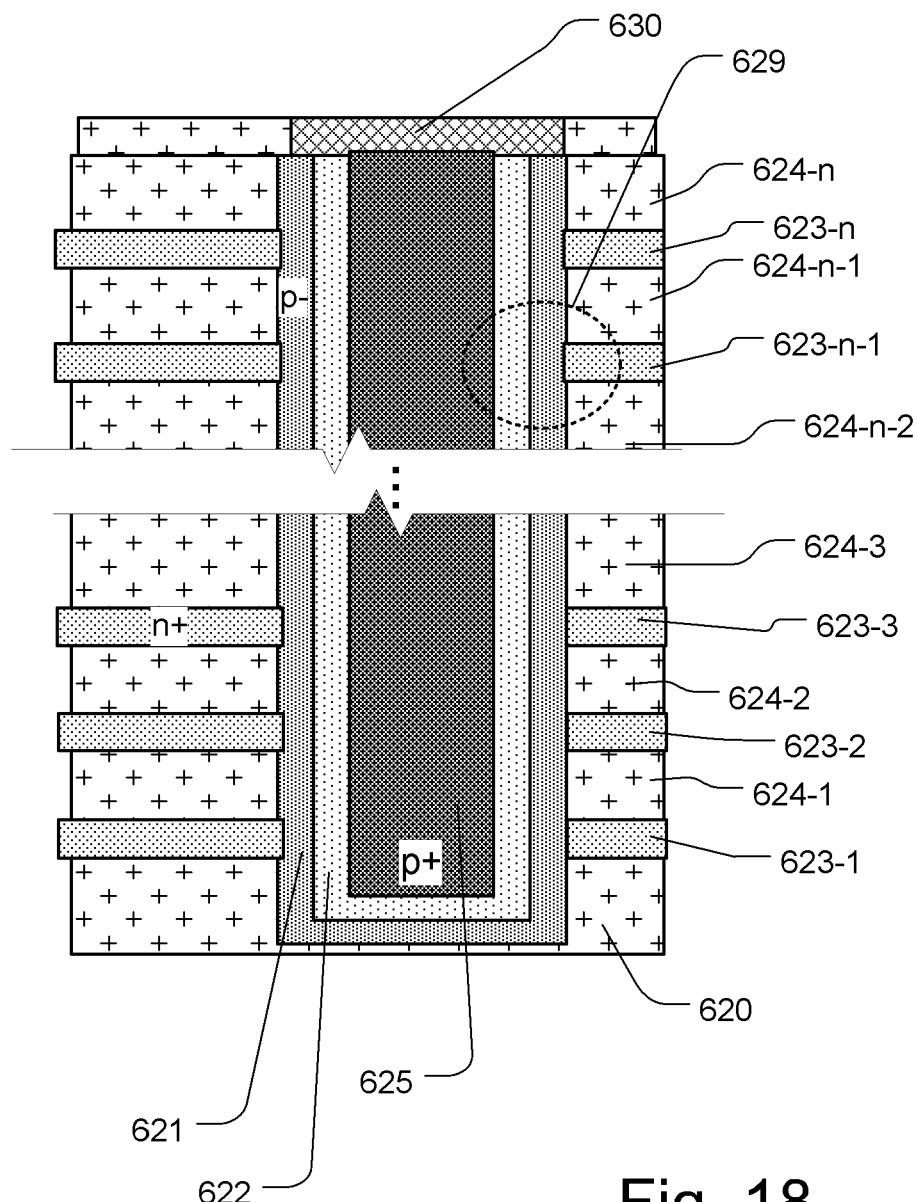
FIG. 18 is a cross-section of an alternative embodiment of a multi-level electrode pillar, including a p+/anti-fuse/p−/n+ structure as the memory element.

FIG. 18 is a cross-section of a multi-level memory cell in yet another alternative, where the memory elements comprises an anti-fuse in series with a rectifier, formed using a p+/oxide/p−/n+ structure in the interface regions, such as region 629. This illustrated embodiment shows an inverted pillar like that of FIG. 17 with a contact 630 on top adapted for connection to decoding circuits. The p+/oxide/p−/n+ structure in the interface regions can also be applied in embodiments with decoding circuitry on the bottom, such as described above. The memory cell stack is formed on an integrated circuit substrate not shown. An insulating layer 620 overlies the substrate. A plurality of conductive layers 623-1 through 623-n overlies the layer 620. Insulating layers 624-1 through 624-n-1 separate the conductive layers 623-1 through 263-n from one another. Insulating layer 624-n covers the top conductive layer 623-n.

A plurality of conductive layers 23-1 through 23-n overlies the contact pad 20 and insulating layer 22. Insulating layers 24-1 through 24-(n−1) separate the conductive layers 23-1 through 23-n from one another. Insulating layer 24-n covers the top conductive layer 23-n. In alternative embodiments, the array of access devices may be formed over the plurality of conductive layers, or between conductive layers, using thin film transistor techniques for example.

The electrode pillar for a multilevel memory as shown in FIG. 18 consists of a conductor including a central core 625 in this example, made for example of a highly doped, p-type polysilicon (p+). The central core 625 is surrounded by a layer 622 of anti-fuse material such as silicon oxide or silicon nitride. A semiconductor sheath 621 surrounds the layer 622 of anti-fuse material, and comprises a lightly doped, p-type (p−) polysilicon or other semiconductor. The conductive layers 623-1 through 623-n comprise a relatively highly doped, n-type (n+) polysilicon in this example, and contact the semiconductor sheath 621.

Interface regions, such as the region 629, between the plurality of conductive layers 623-1 through 523-n and the pillar include memory elements comprising a programmable element which comprises a p+ node in the core 625, an active region in the anti-fuse layer 622, and a p− node in the semiconductor sheath 621, in series with a rectifier which includes a p− node in the semiconductor sheath 621 and a n+ node in the corresponding conductive layer. The manufacturing method for the electode pillar in this embodiment includes defining an electrode via within the plurality of conductive layers; depositing a layer of semiconductor material on sidewalls of the electrode via; forming a layer of anti-fuse material on the layer of semiconductor material; and filling the electrode via over the layer of anti-fuse material with an electrode material.

Figure 19:
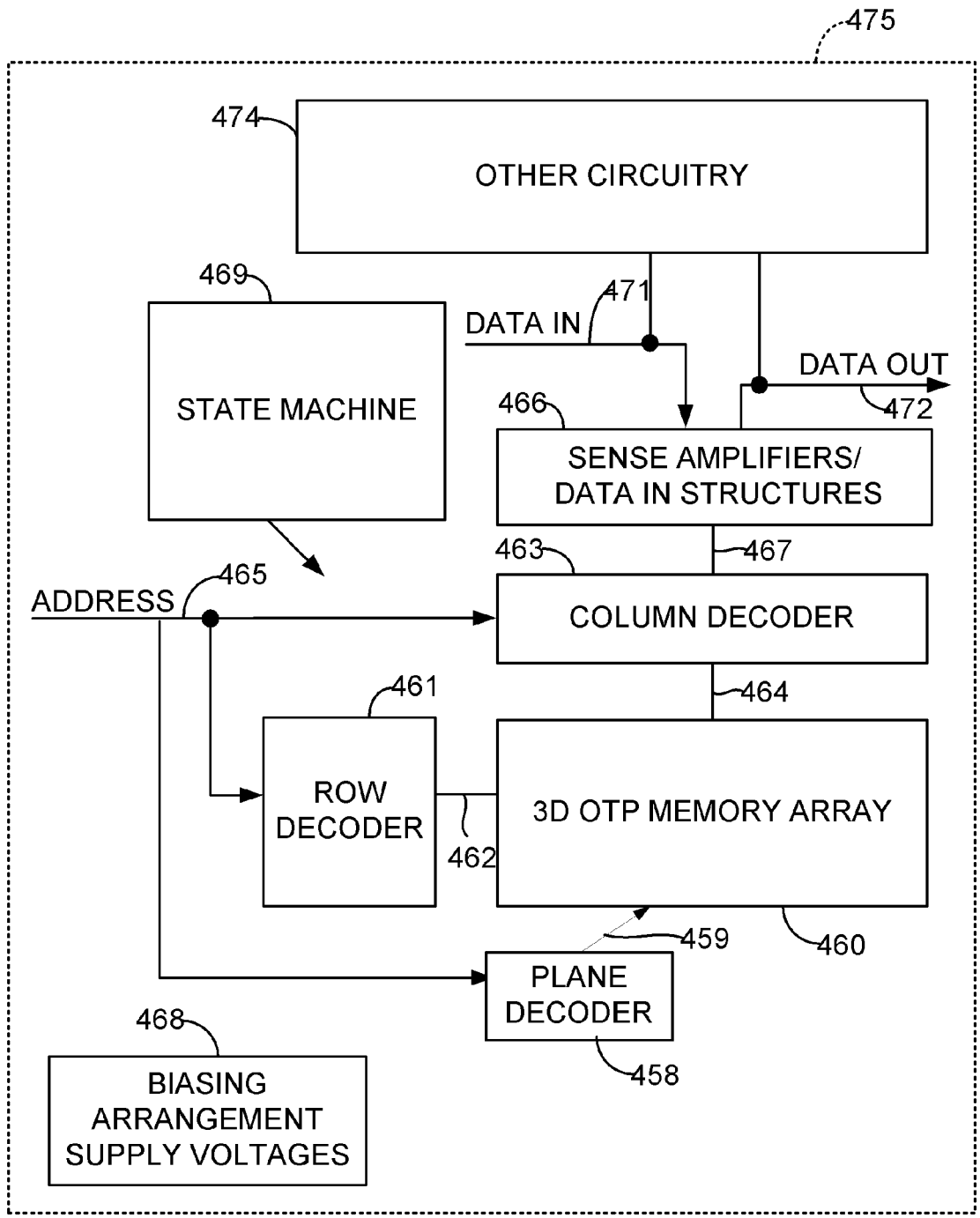
FIG. 19 is a schematic diagram of an integrated circuit including a 3D memory array with row, column and plane decoding circuitry.

FIG. 19 is a simplified block diagram of an integrated circuit according to an embodiment of the present invention. The integrated circuit line 475 includes a 3D memory array 460 implemented as described herein, on a semiconductor substrate. A row decoder 461 is coupled to a plurality of word lines 462, and arranged along rows in the memory array 460. A column decoder 463 is coupled to a plurality of bit lines 464 arranged along columns in the memory array 460 for reading and programming data from the memory cells in the array 460. A plane decoder 458 is coupled to a plurality of electrode planes in the memory array 460 on line 459. Addresses are supplied on bus 465 to column decoder 463, row decoder 461 and plane decoder 458. Sense amplifiers and data-in structures in block 466 are coupled to the column decoder 463 in this example via data bus 467. Data is supplied via the data-in line 471 from input/output ports on the integrated circuit 475 or from other data sources internal or external to the integrated circuit 475, to the data-in structures in block 466. In the illustrated embodiment, other circuitry 474 is included on the integrated circuit, such as a general purpose processor or special purpose application circuitry, or a combination of modules providing system-on-a-chip functionality supported by the thin film fuse phase change memory cell array. Data is supplied via the data-out line 472 from the sense amplifiers in block 466 to input/output ports on the integrated circuit 475, or to other data destinations internal or external to the integrated circuit 475.

A controller implemented in this example using bias arrangement state machine 469 controls the application of bias arrangement supply voltage generated or provided through the voltage supply or supplies in block 468, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   an integrated circuit substrate including an array of access devices;
   a plurality of conductive layers, separated from each other and from the array of access devices by insulating layers;
   an array of electrode pillars extending through and surrounded by the plurality of conductive layers, the electrode pillars in the array contacting corresponding access devices in the array of access devices, and defining interface regions between the electrode pillars and conductive layers in the plurality of conductive layers; and
   memory elements in the interface regions, each of said memory elements comprising a programmable element and a rectifier, the rectifier comprising first and second rectifier elements having first and second conductivity types on opposite sides of the programmable element;
   row decoding circuits and column decoding circuits coupled to the array of access devices arranged to select an electrode pillar in the array of electrode pillars; and
   plane decoding circuits coupled to the plurality of conductive layers arranged to forward bias the rectifiers in the interface regions in a selected conductive layer and to reverse bias the rectifiers in interface regions in a non-selected conductive layer.

2. The memory device of claim 1, wherein an electrode pillar in the array of electrode pillars comprises a conductor in electrical communication with a corresponding access device, and a layer of memory material between the conductor and the plurality of conductive layers, wherein the programmable element in each of said memory elements comprises an active region in the layer of memory material at the interface regions.

3. The memory device of claim 1, wherein an access device in the array of access devices comprises:

a transistor having a gate, a first terminal and a second terminal; and the array including a bit line coupled to the first terminal, a word line coupled to the gate, and wherein the second terminal is coupled to a corresponding electrode pillar in the array of electrode pillars.

4. The memory device of claim 1, wherein an access device in the array of access devices comprises a vertical transistor.

5. The memory device of claim 1, wherein an electrode pillar in the array of electrode pillars comprises a semiconductor material having a first conductivity type in electrical communication with the corresponding access device, said semiconductor material constituting the first rectifier element, and a layer of anti-fuse material between the semiconductor material and the plurality of conductive layers, the layer of anti-fuse material constituting the programmable element; and wherein the plurality of conductive layers comprise doped semiconductor material having a second conductivity type, said doped semiconductor material constituting the second rectifier element, so that the rectifier in each of said memory elements comprises a p-n junction.

6. The memory device of claim 1, wherein the plurality of conductive layers have perimeters, and respective portions of said perimeters are configured for contact to decoding circuitry.

7. The memory device of claim 1, wherein the plurality of conductive layers have perimeters, and respective portions of said perimeters include tabs configured for contact to decoding circuitry, and including a wiring layer overlying said plurality of conductive layers including conductors coupling said plurality of conductive layers to decoding circuitry; and conductive plugs contacting said tabs and extending upwardly to the wiring layer.

8. The memory device of claim 7, wherein said tabs are arranged in an interleaved fashion, so that conductive plugs in the plurality of conductive plugs that are coupled to interleaved tabs on different conductive layers in the plurality of conductive layers are arranged in a row, the row extending in a direction defined by the interleaved tabs.

9. The memory device of claim 1, wherein the electrode pillars comprise respective stacks of electrode portions, where each portion extends through a corresponding set of the plurality of conductive layers.

10. The memory device of claim 1, wherein the array of access devices underlie the plurality of conductive layers.

11. The memory device of claim 1, wherein an electrode pillar in the array of electrode pillars comprises a central core conductor in electrical communication with a corresponding access device, and a layer of memory material on the central core conductor, a semiconductor sheath over the layer of memory material and contacting the plurality of conductive layers, wherein the programmable element in each of said memory elements comprises an active region in the layer of memory material at the interface regions between the central core conductor and the semiconductor sheath.

12. A method for manufacturing a memory device, comprising:

forming an array of access devices on an integrated circuit substrate;

forming a plurality of conductive layers under or over the array of access devices, separated from each other and from the array of access devices by insulating layers;

forming an array of electrode pillars extending through and surrounded by the plurality of conductive layers, the electrode pillars in the array contacting corresponding access devices in the array of access devices, and defining interface regions between the pillar and conductive layers in the plurality of conductive layers;

forming memory elements in the interface regions, each of said memory elements comprising a programmable element in series with a rectifier, the rectifiers comprising first and second rectifier elements having first and second conductivity types on opposite sides of the programmable elements;

forming row decoding circuits and column decoding circuits arranged to select electrode pillars in the array of electrode pillars; and forming plane decoding circuits arranged to forward bias the rectifiers in the interface regions in a selected electrode plane and to reverse bias the rectifiers in interface regions in a non-selected electrode plane.

13. The method of claim 10, wherein said forming a plurality of conductive layers includes blanket deposition of polysilicon.

14. The method of claim 10, wherein said forming a plurality of conductive layers includes:

forming a plurality of blanket layers of conductive material; and forming blanket layers of insulating material between the blanket layers of conductive material.

15. The method of claim 10, wherein said forming an array of electrode pillars includes:

defining an electrode via through the plurality of conductive layers;

depositing a layer of memory material on sidewalls of the electrode via; and filling the electrode via over the layer of memory material with an electrode material.

16. The method of claim 15, wherein said electrode material comprises a doped semiconductor, and the plurality of conductive layers comprise doped semiconductor material of opposite conductivity type.

17. The method of claim 16, wherein said memory material comprises an anti-fuse material.

18. The method of claim 10, wherein said forming a plurality of conductive layers includes:

forming a plurality of blanket layers of conductive material;

etching the plurality of blanket layers to define a taper exposing perimeters of each of the plurality of blanket layers so that perimeters of each of the blanket layers extend in a shelf beyond the perimeters of blanket layers above; and forming a plurality of conductive plugs, said conductive plugs contacting respective shelves, and extending upwardly to a wiring plane overlying said plurality of blanket layers.

19. The method of claim 10, wherein said forming a plurality of conductive layers includes:

forming a plurality of blanket layers of conductive material;

defining perimeters on the plurality of blanket layers of conductive material so that respective portions of said perimeter include tabs configured for contact to decoding circuitry; and forming a plurality of conductive plugs, said conductive plugs contacting respective tabs and extending upwardly to a wiring plane overlying said plurality of conductive layers.

20. The method of claim 19, wherein said tabs are arranged in an interleaved fashion, so that conductive plugs in the plurality of conductive plugs that are coupled to interleaved tabs on different conductive layers in the plurality of conductive layers are arranged in a row, the row extending in a direction defined by the interleaved tabs.

21. The method of claim 10, wherein an electrode pillar in the array of electrode pillars comprises a conductor contacting the corresponding access device, and a layer of memory material between the conductor and the plurality of conductive layers, wherein the programmable element in each of said memory elements comprises an active region in the layer of memory material at the interface regions.

22. The method of claim 12, wherein said forming an array of electrode pillars includes:
defining an electrode via within the plurality of conductive layers;
depositing a layer of semiconductor material on sidewalls of the electrode via;
forming a layer of anti-fuse material on the layer of semiconductor material; and
filling the electrode via over the layer of anti-fuse material with an electrode material.

23. The method of claim 12, wherein an electrode pillar in the array of electrode pillars comprises a core conductor contacting the corresponding access device, a layer of memory material over the core conductor, a layer of semiconductor material between the layer of memory material and the plurality of conductive layers, wherein the programmable element in each of said memory elements comprises an active region in the layer of memory material at the interface regions.

24. A memory device, comprising:
an integrated circuit substrate including an array of electrode pillars, and a plurality of electrode planes that surround the electrode pillars at interface regions;
memory elements in the interface regions comprising programmable elements and rectifiers, the rectifiers comprising first and second rectifier elements having first and second conductivity types on opposite sides of the programmable elements;
row decoding circuits and column decoding circuits arranged to select electrode pillars in the array of electrode pillars; and
plane decoding circuits arranged to forward bias the rectifiers in the interface regions in a selected electrode plane and to reverse bias the rectifiers in interface regions in a non-selected electrode plane.

25. The memory device of claim 1, wherein the first and second rectifier elements directly contact the programmable element.

26. The memory device of claim 1, wherein the programmable element comprises an anti-fuse material.

* * * * *